United States Patent
Goto et al.

(10) Patent No.: US 6,388,504 B1
(45) Date of Patent: May 14, 2002

(54) INTEGRATED CIRCUIT DEVICE WITH SWITCHING BETWEEN ACTIVE MODE AND STANDBY MODE CONTROLLED BY DIGITAL CIRCUIT

(75) Inventors: Yoshiro Goto; Kiyotaka Imai; Naohiko Kimizuka, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/663,356

(22) Filed: Sep. 15, 2000

(30) Foreign Application Priority Data

Sep. 17, 1999 (JP) .......................... 11-263569
Feb. 9, 2000 (JP) ...................... 2000-032047

(51) Int. Cl.⁷ ............................................... H03K 3/01
(52) U.S. Cl. ....................... 327/534; 327/544; 327/546; 327/566
(58) Field of Search ................................. 257/410, 411; 327/564, 565, 566, 534, 537, 544, 530, 546; 365/229

(56) References Cited

U.S. PATENT DOCUMENTS 6,046,627 A * 4/2000 Itoh et al. .................... 327/546
6,049,245 A * 4/2000 Son et al. .................... 327/544
6,100,751 A * 8/2000 De et al. ..................... 327/534
6,225,852 B1 * 5/2001 Cleveland et al. .......... 327/534

FOREIGN PATENT DOCUMENTS

JP           3-71665         3/1991
JP           10-163337       6/1998
JP           11-162973       6/1999

* cited by examiner

*Primary Examiner*—Terry D. Cunningham
*Assistant Examiner*—Paul Dinh
(74) *Attorney, Agent, or Firm*—Sughrue Mion, PLLC

(57) ABSTRACT

In an integrated circuit device, third transistors having the thickest gate insulation film are driven at high voltage and thus operate at high speed with minimal gate leak current. First transistors having the thinnest gate insulation film and second transistors which do not have the thinnest gate insulation film are driven at low voltage, the second transistors being driven at all times and the first transistors being halted as appropriate. The second transistors operate constantly at low speed and with minimal gate leak current, and the first transistors, which have significant gate leak current, operate at high speed while halting as appropriate.

10 Claims, 16 Drawing Sheets

INTEGRATED CIRCUIT DEVICE WITH SWITCHING BETWEEN ACTIVE MODE AND STANDBY MODE CONTROLLED BY DIGITAL CIRCUIT

BACKGROUND OF THE INVENTION

1. Field of the Invention

The present invention relates to an integrated circuit that can be switched between an active mode and standby a mode, and more particularly to an integrated circuit having two processing circuits that are supplied in common by a power-supply voltage.

2. Description of the Related Art

Integrated circuit devices having a plurality of processing circuits are now being manufactured as one-chip microcomputers and are being employed in electronic apparatus such as portable telephones.

An electronic apparatus such as a portable telephone that is carried by a user inevitably takes a battery as its power supply, and batteries are therefore being made lighter and more compact to meet the demand for smaller and lighter devices. However, the additional demand for long operating time results in a drastic need for reduction in the power consumption of these integrated circuit devices. In the case of digital portable telephones, moreover, these integrated circuit devices must also be capable of high-speed operation in order to carry out digital processing of speech signals in real time.

Although waiting for incoming calls necessitates constant operation in the case of a portable telephone, not all components need operate constant. Integrated circuit devices in current portable telephones realize lower power consumption by operating only the minimum necessary processing circuits during standby.

Further, the drive voltage of the transistors of processing circuits may also be increased to accelerate the operation of an integrated circuit device. Merely increasing the drive voltage, however, inevitably increases power consumption, while decreasing the drive voltage lowers the operating speed of transistors, but both decreasing the drive voltage and reducing the thickness of the gate insulation film of transistors can increase ON current and realize high-speed operation while reducing the power consumption.

Reducing the thickness of the gate insulation film of a transistor, however, results in an increase in gate leak current even if the drive voltage is reduced to prevent variation in operating speed. As shown in FIG. 1, if the gate insulation film thickness of a transistor is 20 Å, its gate length is 0.1 $\mu$m and its gate width is 10 $\mu$m, for example, a gate leak current of 10 pA occurs between the gate electrode and semiconductor substrate even with a drive voltage of 1.2 V.

In a CMOS (Complementary Metal Oxide Semiconductor) circuit in particular, drive voltage is constantly applied between one of gate electrodes of the n-type and p-type MOS transistors and the semiconductor substrate, with the result that a gate leak current is constantly generated. Integrated circuit devices currently may integrate several million transistors, and the gate leak current therefore cannot be ignored. In an integrated circuit device having five million CMOS transistors, for example, the total gate leak current reaches a maximum of 25 $\mu$A.

The gate leak current of the transistors therefore increases despite both reducing the power-supply voltage and decreasing the thickness of the gate insulation film of the integrated circuit device so as to realize high-speed operation while reducing power consumption during operation as described hereinabove. As a result, satisfactory reduction of power consumption during standby is problematic. Increasing the thickness of the gate insulation film of the transistors of the integrated circuit device can reduce the gate leak current of the transistors, but this increase in layer thickness complicates high-speed operation.

SUMMARY OF THE INVENTION

It is an object of the present invention to provide an integrated circuit device that is capable of high-speed operation at a low current during operation while reducing power consumption during standby.

It is another object of the present invention to provide an electronic apparatus that includes the above-described integrated circuit device.

It is a further object of the present invention to provide a method of fabricating the above-described integrated circuit device.

According to one aspect of the present invention, an integrated circuit device comprises: means for switching each mode, means for generating a power-supply voltage, a first processing circuit having a first transistor, and a second processing circuit having a second transistor.

The first transistor has the thinnest gate insulation film and is driven by the power-supply voltage only during active mode. The second transistor has a gate insulation film that is thicker than the gate insulation film of the first transistor, and is driven by the power-supply voltage both during active mode and standby mode.

Although the second transistor operates at slower speed because its gate insulation film is not the thinnest, it can be driven in standby mode with minimal gate leak current. Since its gate insulation film is thinnest, the first transistor has greater gate leak current but can be driven to operate at high speed only during active mode.

The integrated circuit device executes processing that requires high-speed operation by high-speed transistors and executes processing that does not require high-speed operation by transistors having minimal leak current and therefore is capable of comprehensively realizing high-speed operation while reducing leak currents and can realize both higher performance and lower power consumption.

In an embodiment, an integrated circuit device further comprises a third processing circuit having a third transistor. The third transistor has a gate insulation film that is thicker than the gate insulation film of the second transistor and is driven at a higher voltage than the first and second transistors.

The third transistor has a high drive voltage and operates at high speed with little gate leak current because its gate insulation film is thickest. The first transistor has a low drive voltage, and although it has significant gate leak current because its gate insulation film is thinnest, it operates at high speed only during active mode. The second transistor does not have the thinnest gate insulation film and is driven by a low voltage and therefore can also operate in standby mode at a lower speed than the first transistor with minimal gate leak current.

The integrated circuit device executes processing requiring high-speed operation by high-speed transistors and executes processing that does not require high-speed operation by transistors having minimal leak current, and therefore is capable of comprehensively realizing high-speed operation while reducing leak currents and can provide both higher performance and lower power consumption.

In an embodiment, the second processing circuit turns the first processing circuit ON and OFF. In this case, a first processing circuit that is capable of high-speed operation but which is prone to significant gate leak current during standby can be turned ON and OFF by a second processing circuit that has slow operation but minimal gate leak current.

In an embodiment, the second processing circuit begins supplying voltage to the first processing circuit upon detecting the input of a prescribed signal from the outside during standby mode. In this case, the first processing circuit in standby mode can be activated by the input of a prescribed signal from the outside.

In an embodiment, the gate insulation film of the first transistor is composed of a thermal oxidation film that has been grown on the surface of a semiconductor substrate, and the gate insulation film of the second transistor is composed of a thermal oxidation film that has been grown, simultaneously with the gate insulation film of the first transistor, on the surface of a semiconductor substrate in which at least one of argon, fluorine, and a fluorine compound has been implanted.

In this case, the thermal oxidation film that is grown on the surface of a semiconductor substrate in which at least one of argon, fluorine, and a fluorine compound has been implanted is thicker than a thermal oxidation film that is grown at the same time on a surface that has not been implanted. The gate insulation film of the second transistor can thus be formed as a thicker layer than the gate insulation film of the first transistor, whereby first and second transistors having gate insulation films of differing thicknesses can be fabricated by a simple method.

In an embodiment, the gate insulation film of the second transistor is composed of a thermal oxidation film that is grown on the surface of a semiconductor substrate; and the gate insulation film of the first transistor is composed of a thermal oxidation film that is grown simultaneously with the gate insulation film of the second transistor on the surface of a semiconductor substrate that has been implanted with at least one of indium and nitrogen.

In this case, a thermal oxidation film that is grown on the surface of a semiconductor substrate implanted with at least one of indium and nitrogen is thinner than a thermal oxidation film that is grown simultaneously on a surface that is not implanted. As a result, the gate insulation film of the first transistor can be formed thinner than the gate insulation film of the second transistor, and first and second transistors having gate insulation films of differing thicknesses can be fabricated by a simple method.

In an embodiment, a battery is separate from the integrated circuit device, and the power-supply voltage is supplied to the integrated circuit device from this battery. In this case, the power-supply voltage generated by the battery can be supplied in common to the first and second processing circuits.

According to one aspect of the present invention, an electronic apparatus comprises: means for switching between each mode, a first processing circuit having a first transistor, a second processing circuit having a second transistor, a power supply that generates the power-supply voltage, a battery that supplies the main unit power to the power supply, and a power supply switch that turns the battery ON and OFF.

When the power supply switch is turned ON, the main unit power is supplied from the battery to the power supply, this power-supply voltage being supplied to the second processing circuit at all times but supplied to the first processing circuit only during active mode. The second transistor does not have the thinnest gate insulation film and therefore operates at a low speed, but this transistor can also be driven in the standby mode with minimal gate leak current. Since the first transistor has the thinnest gate insulation film, it has considerable gate leak current, but this transistor is driven at a high operating speed only during active mode. The first and second transistors are thus optimized according to respective modes and operating speeds, and the integrated circuit device therefore is capable of comprehensively realizing high-speed operation while reducing the leak current and can provide both a higher level of performance and lower power consumption.

According to another aspect of the present invention, an electronic apparatus comprises: means for switching between each mode, a first processing circuit having a first transistor, a second processing circuit having a second transistor, a third processing circuit having a third transistor, a low-voltage power supply, a high-voltage power supply, a battery for supplying main unit power to the power supplies, a power supply switch for turning the battery ON and OFF, and a notification means for notifying the second processing circuit of the need or lack of need for operation of the first processing circuit.

The low-voltage power supply supplies a low voltage in common to the first and second processing circuits of the integrated circuit device, and the high-voltage power supply supplies high voltage to the third processing circuit. The notification means reports to the second processing circuit of prescribed data that can determine the need for operation of the first processing circuit, and this second processing circuit turns the first processing circuit ON and OFF in accordance with the report of the notification means, whereby the integrated circuit device can provide both higher performance and lower power consumption.

According to one aspect of the present invention, in a first circuit fabrication method for fabricating an integrated circuit device of the present invention, a thermal oxidation film is formed over the entire surface of a semiconductor substrate, and a resist mask is formed at the positions of first and third processing circuits on the surface of this thermal oxidation film. The thermal oxidation film at the position of the second processing circuit that is left exposed by the resist mask is implanted with at least one of argon, fluorine, and a fluorine compound, and following this implantation, the thermal oxidation film is removed at the positions of the first and second processing circuits. A thermal oxidation film is grown at the position of the third processing circuit, and a thermal oxidation film is grown over the entire surface of the semiconductor substrate that has been implanted at the position of the second processing circuit, these thermal oxidation films forming the gate electrodes of the first transistor and the second and third transistors, thereby producing the integrated circuit device of this invention.

Thus, in the circuit fabrication method of this invention, thermal oxidation films are formed simultaneously at the positions of the first and second processing circuits of the integrated circuit device of the present invention, but since argon, fluorine, or a fluorine compound is implanted only at the position of the second processing circuit, the growth of the thermal oxidation film at the position of the second processing circuit can be accelerated more than at the position of the first processing circuit. In addition, the thermal oxidation film at the position of the third processing circuit, which is composed of two layers, can be formed thicker than the position of the second processing circuit. As a result, a gate insulation film of the first transistor having thickness a, a gate insulation film of the second transistor having thickness b, and a gate insulation film of the third transistor having thickness c, these thicknesses satisfying the relation "a<b<c," can be formed by a simple process on the surface of one semiconductor substrate.

According to another aspect of the present invention, in a second circuit fabrication method for fabricating an integrated circuit device of the present invention, a thermal oxidation film is grown across the entire surface of a semiconductor substrate, and a resist mask is formed at the position of the third processing circuit on the surface of this thermal oxidation film. The thermal oxidation film at the positions of the first and second processing circuits that is left exposed by this resist mask is removed, and a resist mask is formed at the position of the second processing circuit where this thermal oxidation film was removed. At least one of indium and nitrogen is implanted into the semiconductor substrate at the position of this first processing circuit that is exposed from this resist mask, and following this implantation, the resist mask is removed and a thermal oxidation film grown over the entire surface of the semiconductor substrate. The gate electrodes of the first transistor and the second and third transistors are formed by this thermal oxidation film, thereby producing the integrated circuit device of the present invention.

Thus, according to the circuit fabrication method of this invention, thermal oxidation films are formed simultaneously at the positions of the first and second processing circuits of the integrated circuit device of this invention, but since indium or nitrogen is implanted only at the position of the first processing circuit, the growth of the thermal oxidation film at the position of the first processing circuit can be reduced from that of the position of the second processing circuit. In addition, the thermal oxidation film at the position of the third processing circuit, which is composed of two layers, can be formed thicker than the position of the second processing circuit. As a result, a gate insulation film of thickness a of the first transistor, a gate insulation film of thickness b of the second transistor, and a gate insulation film of thickness c of the third transistor, these thicknesses satisfying the relation "a<b<c," can be formed by a simple process on the surface of one semiconductor substrate.

According to a further aspect of the present invention, in a third circuit fabrication method for fabricating an integrated circuit device of the present invention, a thermal oxidation film is grown over the entire surface of a semiconductor substrate, and a thermal oxidation mask for preventing thermal oxidation is formed at the position of a first processing circuit on the surface of this thermal oxidation film. A thermal oxidation film is grown on the surface of the semiconductor substrate at the positions of the second and third processing circuits that are left exposed by this thermal oxidation mask, and a resist mask is formed at the position of the third processing circuit on this thermal oxidation film. The thermal oxidation film at the position of the second processing circuit that is left exposed by this resist mask and thermal oxidation mask is removed, and after removing this thermal oxidation film, the resist mask is removed. A thermal oxidation film is grown at the positions of the second and third processing circuits that are left exposed by the thermal oxidation mask, and the gate electrodes of the first transistor and the second and third transistor are formed from the thermal oxidation film, thereby fabricating the integrated circuit device of the present invention.

Thus, in the circuit fabrication method of the present invention, after causing a thermal oxidation film to grow to an appropriate thickness at the position of the first processing circuit of the integrated circuit device of the present invention, this film is shielded by a thermal oxidation mask, and a thermal oxidation film is grown at the positions of a second and third processing circuits, whereby thermal oxidation films can be grown at particular thicknesses at the positions of the first and second processing circuits. In addition, the thermal oxidation film at the position of the third processing circuit, which is composed of two layers, can be formed thicker than the position of the second processing circuit. As a result, a gate insulation film of thickness a of the first transistor, a gate insulation film of thickness b of the second transistor, and a gate insulation film of thickness c of the third transistor, these thicknesses satisfying the relation "a<b<c," can be formed by a simple process on the surface of one semiconductor substrate.

According to still another aspect of the present invention, in a fourth circuit fabrication method of an integrated circuit device of the present invention, a thermal oxidation film is formed over the entire surface of a semiconductor substrate, and a thermal oxidation mask for preventing thermal oxidation is formed at the position of the second processing circuit on the surface of this thermal oxidation film. A thermal oxidation film is formed on the surface of the semiconductor substrate at the positions of the first and third processing circuits that are left exposed by this thermal oxidation mask, and a resist mask is formed at the position of the third processing circuit on the surface of this thermal oxidation film. The thermal oxidation film at the position of the first processing circuit that is left exposed by this resist mask and thermal oxidation mask is removed, and after removing this thermal oxidation film, the resist mask is removed. A thermal oxidation film is grown at the positions of the first and third processing circuits that are left exposed by the thermal oxidation mask, and the gate electrodes of the first transistor, the second transistor, and the third transistor are formed by the thermal oxidation film, whereby the integrated circuit device of the present invention is fabricated.

Thus, in the circuit fabrication method of the present invention, a thermal oxidation film is grown to an appropriate layer thickness at the position of the second processing circuit of the integrated circuit device of the present invention, following which this thermal oxidation film is shielded by a thermal oxidation mask, thermal oxidation films are caused to grow at the positions of the first and third processing circuits, whereby the thermal oxidation films at the positions of the first and second processing circuits can each be formed to particular thicknesses. In addition, the thermal oxidation film at the position of the third processing circuit, which is composed of two layers, can be formed thicker than at the position of the second processing circuit. As a result, a gate insulation film of thickness a of the first transistor, a gate insulation film of thickness b of the second transistor, and a gate insulation film of thickness c of the third transistor, these thicknesses satisfying the relation "a<b<c," can be easily formed on the surface of one semiconductor substrate.

In an embodiment, a thermal oxidation mask is formed on a conductive layer, and at least the gate electrode of the first transistor is formed by this conductive layer. In this case, the productivity of the integrated circuit device can be improved because the gate electrode of the first transistor is formed from the conductive layer of a thermal oxidation mask that is formed to control the thickness of the gate insulation film of the first transistor.

In an embodiment, the conductive layer of a thermal oxidation mask is formed from a polysilicon film. In this case, the polysilicon film can effectively prevent the physical thermal oxidation of the lower layer and can be used as the conductive layer of the gate electrode, thereby enabling the effective production of an integrated circuit device having good properties.

According to yet a further aspect of the present invention, in a fifth circuit fabrication method for fabricating an integrated circuit device of the present invention, a thermal oxidation film is grown over the entire surface of a semiconductor substrate, and a first polysilicon film for preventing thermal oxidation is formed at the position of the first processing circuit on the surface of this thermal oxidation film. A thermal oxidation film is grown on the surface of the first polysilicon film at the positions of the exposed second and third processing circuits, and a resist mask is formed at the position of the third processing circuit on the surface of this thermal oxidation film. The thermal oxidation film is removed from the surface of the first polysilicon film at the position of the second processing circuit that is exposed from this resist mask, and after removal of this thermal oxidation film, the resist mask is removed. A thermal oxidation film is grown on the surface of the first polysilicon film at the positions of the second and third processing circuits, and a second polysilicon film is formed on the surfaces of this thermal oxidation film and the first polysilicon film. A resist mask is formed at the positions of the second and third processing circuits on the surface of this second polysilicon film, and the second polysilicon film is removed at the position of the first processing circuit that is left exposed by this resist mask. The thermal oxidation film at the position of the first processing circuit that is exposed by this removal is removed to expose the first polysilicon film, and the resist mask is removed from the positions of the second and third processing circuits to expose the second polysilicon film. The first polysilicon film at the position of the first processing circuit is patterned to form the gate electrode of the first transistor and the second polysilicon film at the positions of the second and third processing circuits is patterned to form the gate electrodes of the second and third transistors, thereby producing the integrated circuit device of the present invention.

Thus, in the circuit fabrication method of this invention, after growing a thermal oxidation film at the position of the first processing circuit of the integrated circuit device of this invention to an appropriate thickness, this thermal oxidation film is shielded by a first polysilicon film and a thermal oxidation film is grown at the positions of the second and third processing circuits, whereby the thermal oxidation films at the positions of the first and second processing circuits are each formed at particular thicknesses. Since the thermal oxidation film at the position of the third processing circuit is composed of two layers, it can be formed thicker than at the position of the second processing circuit. In addition, the gate electrode of the first transistor is formed from the first polysilicon film, which is formed to control the thickness of the gate insulation film of the first transistor.

Accordingly, the thermal oxidation films at the positions of the first and second processing circuits can each be formed to a particular thickness, and the thermal oxidation film at the position of the third processing circuit, which is composed of two layers, can be formed thicker than at the position of the second processing circuit. As a result, the gate insulation film of thickness a of the first transistor, the gate insulation film of thickness b of the second transistor, and the gate insulation film of thickness c of the third transistor, these thicknesses satisfying the relation "a<b<c," can be formed by a simple process on the surface of one semiconductor substrate.

According to yet a further aspect of the present invention, in the sixth circuit fabrication method for fabricating an integrated circuit device of the present invention, a thermal oxidation film is grown over the entire surface of a semiconductor substrate, and a first polysilicon film for preventing thermal oxidation is formed at the position of the second processing circuit on the surface of this thermal oxidation film. A thermal oxidation film is grown on the surface of the first polysilicon film at the positions of the exposed first and third processing circuits, and a resist mask is formed at the position of the third processing circuit on the surface of this thermal oxidation film. The thermal oxidation film is removed from the surface of the first polysilicon film and the position of the first processing circuit that is left exposed by this resist mask, and the resist mask is removed after this removal of the thermal oxidation film. A thermal oxidation film is grown on the surface of the first polysilicon film at the positions of the first and third processing circuits, and a second polysilicon film is formed on the surface of this thermal oxidation film and the first polysilicon film. A resist mask is formed at the positions of the first and third processing circuits on the surface of this second polysilicon film, and the second polysilicon film is removed at the position of the second processing circuit that is left exposed by this resist mask. The thermal oxidation film at the position of the second processing circuit that is exposed by this removal is removed to expose the first polysilicon film, and the resist mask is removed from the positions of the first and third processing circuits to expose the second polysilicon film. The first polysilicon film at the position of the second processing circuit is patterned to form the gate electrode of the second transistor, and the second polysilicon film at the positions of the first and third processing circuits is patterned to form the gate electrodes of the first and third transistors, thereby producing the integrated circuit device of the present invention.

Thus, in the circuit fabrication method of the present invention, the thermal oxidation film at the position of the second processing circuit of the integrated circuit device of the present invention is grown to an appropriate thickness, following which this thermal oxidation film is shielded by a first polysilicon film to grow thermal oxidation films at the positions of the first and third processing circuits, whereby the thermal oxidation films at the positions of the first and second processing circuits are each grown to a particular thickness. Since the thermal oxidation film at the position of the third processing circuit is composed of two layers, it is formed thicker than the position of the second processing circuit. In addition, the gate electrode of the second transistor is formed from the first polysilicon film, which is formed for controlling the thickness of the gate insulation film of the second transistor.

Accordingly, the thermal oxidation film at the positions of the first and second processing circuits can each be formed to a particular thickness, and the thermal oxidation film at the position of the third processing circuit, which is composed of two layers, can be formed thicker than the position of the second processing circuit. As a result, the gate insulation film of thickness a of the first transistor, the gate insulation film of thickness b of the second transistor, and the gate insulation film of thickness c of the third transistor, these thicknesses satisfying the relation "a<b<c," can be formed by a simple process on the surface of one semiconductor substrate.

According to yet a further aspect of the present invention, in a seventh circuit fabrication method for fabricating an integrated circuit device of the present invention, a thermal oxidation film is grown over the entire surface of a semiconductor substrate, and a first polysilicon film for preventing thermal oxidation is formed on the surface of this thermal oxidation film at the position of the first processing circuit. A thermal oxidation film is formed on the surface of the first polysilicon film at the positions of the exposed second and third processing circuits, and a resist mask is formed at the position of the third processing circuit on the surface of this thermal oxidation film. The thermal oxidation film is removed from the surface of the first polysilicon film at the position of the second processing circuit that is left exposed from this resist mask, and the resist mask is removed after this removal of the thermal oxidation film. A thermal oxidation film is grown on the surface of the first polysilicon film at the positions of the second and third processing circuits, and a second polysilicon film is formed on the surfaces of this thermal oxidation film and the first polysilicon film. This second polysilicon film is removed from the position of the first processing circuit and patterned at the positions of the second and third processing circuits to form the gate electrodes of the second and third transistors, a resist mask is formed at the positions of the second and third processing circuits, and the first polysilicon film at the position of the first processing circuit that is left exposed by this resist mask is patterned to form the gate electrode of the first transistor, thereby producing the integrated circuit device of the present invention.

Thus, in the circuit fabrication method of the present invention, a thermal oxidation film is grown at the position of the first processing circuit of the integrated circuit device of the present invention to an appropriate thickness, following which this thermal oxidation film is shielded by a first polysilicon film and a thermal oxidation film is grown at the positions of the second and third processing circuits, whereby the thermal oxidation films at the positions of the first and second processing circuits are each formed to a particular thickness. Since the thermal oxidation film at the position of the third processing circuit is composed of two layers, it is formed thicker than at the position of the second processing circuit. In addition, the gate electrode of the first transistor is formed from the first polysilicon film that is formed for controlling the thickness of the gate insulation film of the first transistor. Finally, the etching of the gate electrode located on the surface of the thinnest gate insulation film of the first transistor is performed separately from the etching of the gate electrodes of the second and third transistors.

Accordingly, the thermal oxidation films at the positions of the first and second processing circuits can each be formed to a particular thickness, and the thermal oxidation film at the position of the third processing circuit, which is composed of two layers, can be formed thicker than the position of the second processing circuit. As a result, the gate insulation film of thickness a of the first transistor, the gate insulation film of thickness b of the second transistor, and the gate insulation film of thickness c of the third transistor, these thicknesses satisfying the relation "a<b<c," can be formed by a simple process on the surface of one semiconductor substrate. Finally, not only can the productivity of the integrated circuit device be improved, but the gate electrodes of the first to third transistors can each be etched under the respective optimum conditions.

According to yet a further aspect of the present invention, in the eighth circuit fabrication method for fabricating an integrated circuit device of the present invention, a thermal oxidation film is grown over the entire surface of a semiconductor substrate, and a first polysilicon film for preventing thermal oxidation is formed at the position of the second processing circuit on the surface of this thermal oxidation film. A thermal oxidation film is grown on the surface of the first polysilicon film at the positions of the exposed first and third processing circuits, and a resist mask is formed at the position of the third processing circuit on the surface of this thermal oxidation film. The thermal oxidation film is removed from the surface of the first polysilicon film and the position of the first processing circuit that is left exposed by this resist mask, and the resist mask is removed after this removal of the thermal oxidation film. A thermal oxidation film is grown on the surface of the first polysilicon film and at the positions of the first and third processing circuits, and a second polysilicon film is formed on the surfaces of this thermal oxidation film and the first polysilicon film. This second polysilicon film is both removed from the position of the second processing circuit and patterned at the positions of the first and third processing circuits to form the gate electrodes of the first and the third transistors, a resist mask is formed at the positions of the first and third processing circuits, and the first polysilicon film at the position of the second processing circuit that is left exposed by this resist mask is patterned to form the gate electrode of the second transistor, thereby producing the integrated circuit device of the present invention.

Thus, in the circuit fabrication method of the present invention, a thermal oxidation film is grown to an appropriate thickness at the position of the second processing circuit of the integrated circuit device of the present invention, following which this thermal oxidation film is shielded by a first polysilicon film to grow thermal oxidation films at the positions of the first and third processing circuits, whereby the thermal oxidation film at the positions of the first and second processing circuits are each formed to a particular thickness. Since the thermal oxidation film at the position of the third processing circuit is composed of two layers, it is formed thicker than at the position of the second processing circuit. In addition, the gate electrode of the second transistor is formed from the first polysilicon film that is formed for controlling the thickness of the gate insulation film of the-second transistor. Finally, the etching of the gate electrode that is located on the surface of the thinnest gate insulation film of the second transistor is carried out separately from the etching of the gate electrodes of the first and third transistors.

Accordingly, the thermal oxidation films at the positions of the first and second processing circuits can each be formed to a particular thickness, and the thermal oxidation film at the position of the third processing circuit, which is composed of two layers, can be formed thicker than the position of the second processing circuit. As a result, the gate insulation film of thickness a of the first transistor, the gate insulation film of thickness b of the second transistor, and the gate insulation film of thickness c of the third transistor, these thicknesses satisfying the relation "a<b<c," can be formed by a simple process on the surface of one semiconductor substrate. Finally, not only can the productivity of the integrated circuit device be improved, but the gate electrodes of the first to third transistors can each be etched under the respective optimum conditions.

The above and other objects, features, and advantages of the present invention will become apparent from the following description with reference to the accompanying drawings which illustrate examples of the present invention.

BRIEF DESCRIPTION OF THE DRAWINGS

FIGS. 13(a) to 12(c) is a process chart showing the latter portion of the circuit fabrication method;

FIGS. 17(a) to 17(c) is a process chart showing the last half of the circuit fabrication method.

DETAILED DESCRIPTION OF THE PREFERRED EMBODIMENTS

First Embodiment

Figure 3:
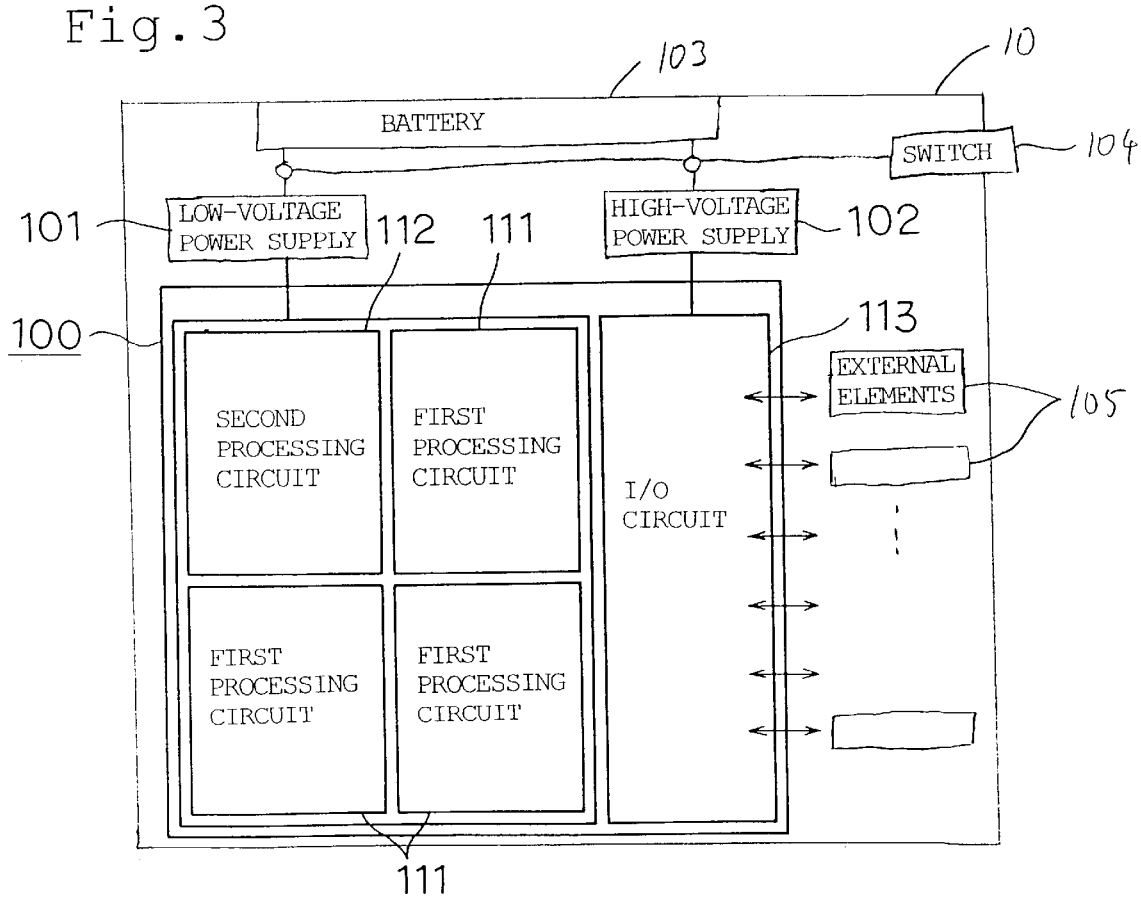
FIG. 3 is a block diagram showing the typical overall construction of an integrated circuit device.

Referring now to FIG. 3, that is shown an integrated circuit device 100 according to an embodiment of the present invention formed as one portion of portable telephone 10, which is an electronic apparatus. Portable telephone 10 includes, in addition to integrated circuit device 100, low-voltage power supply 101, high-voltage power supply 102, battery 103, power supply switch 104, and various external elements 105.

Battery 103 is removably incorporated in the telephone body and supplies main unit power to each of power supplies 101 and 102. Power supply switch 104 is provided on the outside of the telephone body in a state allowing manual operation and turns ON and OFF the supply of power from battery 103 to each of power supplies 101 and 102. Low-voltage power supply 101 generates a low voltage A (=B) of 1.2 V from the main unit power that is supplied from battery 103, and high-voltage power supply 102 generates a high voltage C of 3.3 V.

Integrated circuit device 100 of this embodiment includes three first processing circuits 111, one second processing circuit 112, and one I/O (Input/Output) circuit 113, which is the third processing circuit, these components being interconnected. Low-voltage power supply 101 is connected to first processing circuits 111 and second processing circuit 112; and high-voltage power supply 102 and various external elements 105 are connected to I/O circuit 113.

As described hereinabove, integrated circuit device 100 of this embodiment is formed as one portion of portable telephone 10, and is set to allow switching between an active mode and a standby mode. All components of integrated circuit device 100 are supplied with power-supply voltage in active mode, but only a portion of the components are supplied with power-supply voltage in standby mode.

I/O circuit 113 is constantly driven in both the active mode and standby mode by high voltage C of 3.3 V that is supplied from high-voltage power supply 102, and receives and outputs various data to and from various external elements 105.

Second processing circuit 112 is constantly driven in both active mode and standby mode by low voltage B of 1.2 V that is supplied from low-voltage power supply 101, and halts first processing circuits 111 during standby mode and activates first processing circuits 111 during active mode by controlling the supply of voltage to first processing circuits 111.

First processing circuits 111, which operate only during active mode under the control of second processing circuit 112, are driven during this operation by low voltage A (=B) of 1.2 V that is supplied from low-voltage power supply 101, and execute various processes in accordance with data that are exchanged with the outside by I/O circuit 113.

Figure 1:
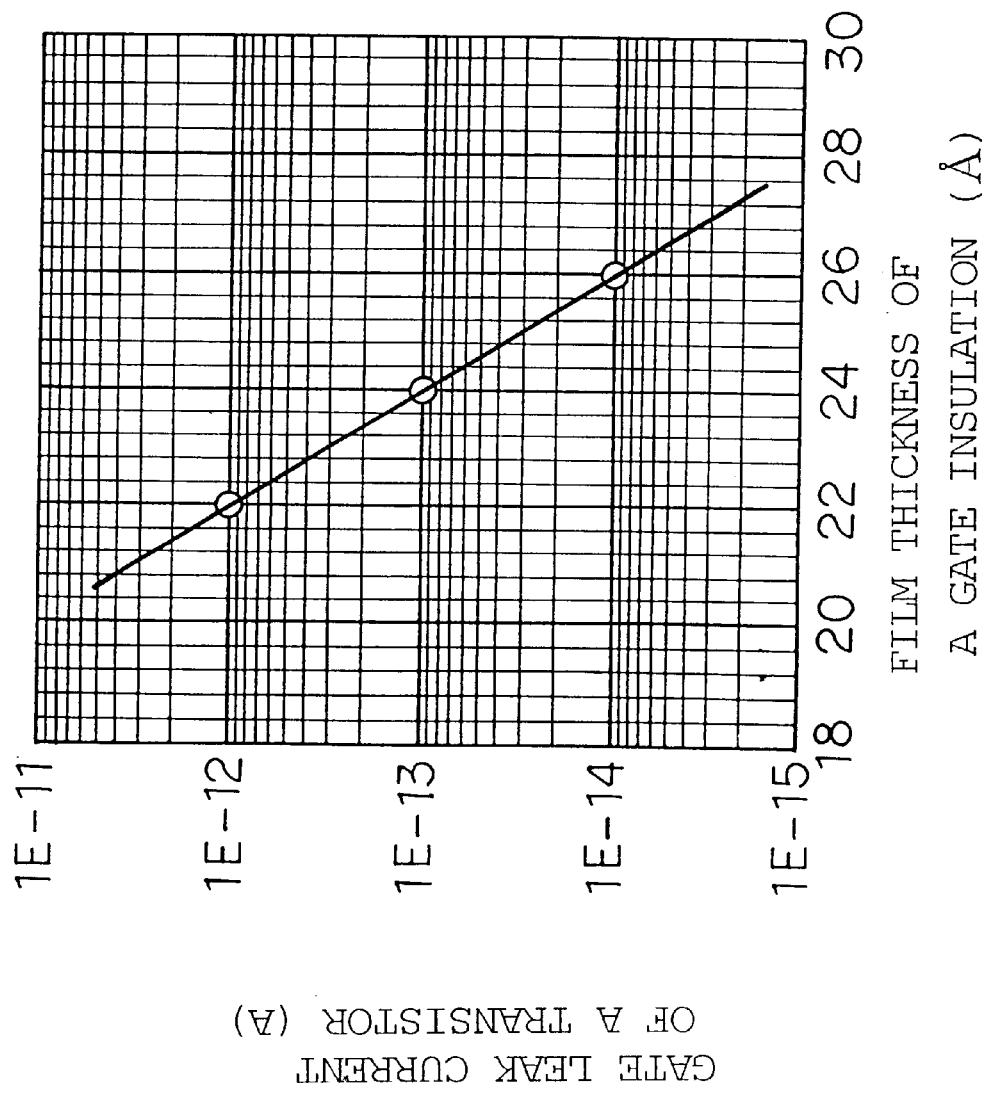
FIG. 1 shows characteristics and shows the relation between the drive voltage of a transistor of the prior art and the gate leak current.
Figure 2:
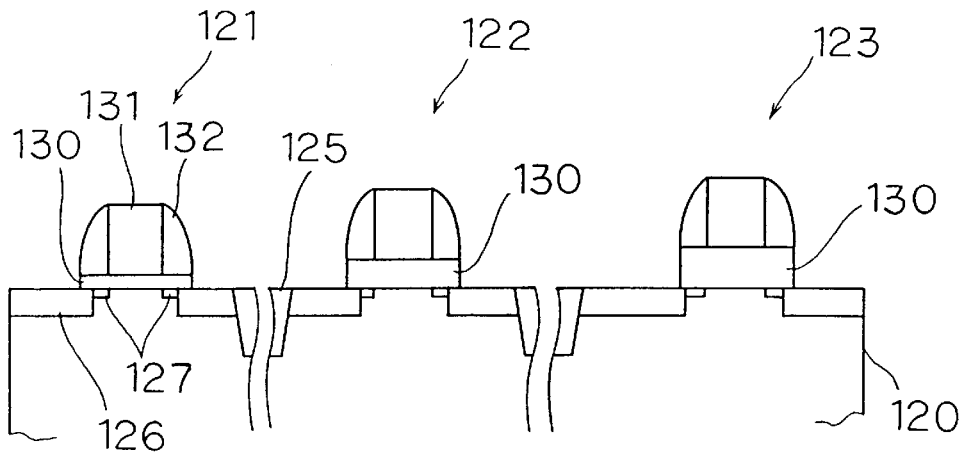
FIG. 2 is a sectional view showing the internal construction of the principle components of an integrated circuit device according to the first embodiment of the present invention.

First processing circuits 111, second processing circuit 112, and I/O circuit 113 are formed on a single semiconductor substrate 120 made of silicon, and as shown in FIG. 2, at least one portion of the various types of circuit elements of first processing circuits 111 is composed of a large number of first transistors 121. Similarly, at least one portion of the various types of circuit elements of second processing circuit 112 is composed of a multiplicity of second transistors 122, and I/O circuit 113 is composed of a multiplicity of third transistors 123.

In this embodiment, first to third transistors 121–123 are each formed by MOSFETs (Metal Oxide Semiconductor Field-Effect Transistors) of LDD (Lightly Doped Drain-source) construction on a single semiconductor substrate 120, and are separated from each other as necessary by trenches 125.

Reference numeral 126 in the figures indicates a high-concentration source-drain region, and 127 indicates a low-concentration region. In addition, 130 indicates a gate insulation film composed of a thermal oxidation film, 131 indicates a gate electrode composed of a polysilicon film, and 132 indicates a side wall composed of an oxide film.

As described hereinabove, although first to third transistors 121–123 are formed of a similar construction, the thicknesses a–c of their gate insulation films 130 satisfy the relation: a<b<c.

To state in greater detail, thickness a of gate insulation film 130 of first transistor 121 is 20 Å, thickness b of gate insulation film 130 of second transistor 122 is 24 Å, and thickness c of gate insulation film 130 of third transistor 123 is 70 Å.

In addition, thickness a of gate insulation film 130 of first transistor 121 may be less than 21 Å since the operating speed of the transistor increases with decreasing thickness of the gate insulation film. Excessive thinness of this film, however, raises problems of reliability over long-term use and uniformity of thickness, and the above-described thickness of 20 Å is therefore adopted.

Thickness b of gate insulation film 130 of second transistor 122 is in the range of 22–28Å and should be at least 2.0 Å greater than thickness a, the above-described thickness resulting in a gate leak current that is sufficiently smaller than the off-leak (the drain current when the potential difference between the gate electrode and substrate is "0") such that the contribution of the gate leak current with respect to the current consumption during standby is negligible. A thickness of 24 Å is therefore adopted.

Finally, in the interest of higher operating speed, thickness c of gate insulation film 130 of third transistor 123 should be as small as possible, but since this transistor is subjected to a high voltage of as much as 3.3 V, a thickness of 40 Å or more is required in order to maintain reliability over long-term use, and a thickness of 70 Å is adopted here to guarantee adequate reliability.

As described hereinabove, first processing circuits 111 are driven at low voltage A of 1.2 V only during active mode, second processing circuit 112 is driven at low voltage B (=A) of 1.2 V during both standby and active modes, and I/O circuit 113 is driven at high voltage C of 3.3 V during both standby and active modes, a relation of A=B<C being established between the voltages A–C that drive first to third transistors 121–123.

In the above-described construction, integrated circuit device 100 of the present embodiment is formed as a portion of portable telephone 10, which is an electronic apparatus. I/O circuit 113 receives and outputs various types of data to and from various types of external elements 105, and first processing circuits 111 execute various processes in accordance with the data that are exchanged with the outside by this I/O circuit 113.

Portable telephone 10 of this embodiment can be switched between active mode and standby mode as described hereinabove, and as in the prior art, is set to operate in active mode when originating or receiving a call.

Portable telephone 10 otherwise is set in standby mode and waits, and during standby, the drive of most of the circuits is halted to prevent needless power consumption. Since immediate operation is necessary upon call incoming during this standby mode, circuits operate during standby that detect call incoming and activate circuits that are at rest.

For this purpose, portable telephone 10 of this embodiment includes a notification circuit (not shown in the figures), which is the notification means, and this notification circuit posts to processing circuit 112 prescribed data that can determine the need for operation of first processing circuits 111. This second processing circuit 112 accordingly controls the supply of voltage to first processing circuits 111.

As a result, I/O circuit 113 and second processing circuit 112 are constantly driven regardless of the set mode of portable telephone 10. The supply of power to first processing circuits 111 is cut off in the standby mode of portable telephone 10, thereby preventing the needless consumption of power by processing circuits 111 during standby.

Although first processing circuits 111, second processing circuit 112, and I/O circuit 113 are integrated on a single semiconductor substrate 120 in integrated circuit device 100 of this embodiment, first to third transistors 121–123 are optimized according to respective modes and operating speeds, whereby the integrated circuit device is capable of comprehensively realizing high-speed operation while decreasing leak currents and can offer both a higher level of performance and a lower level of energy consumption.

In other words, I/O circuit 113 exchanges data with external elements 105 such as memory that operate at a power-supply voltage of, for example, 3.3 V and must therefore be constantly supplied with a high-voltage power-supply voltage C of 3.3 V, but gate insulation film 130 of third transistors 123 of I/O circuit 113 is thickest at a thickness c of 70 Å, thereby enabling operation with a minimal gate leak current.

In contrast, thickness a of gate insulation film 130 of first transistors 121 is the thinnest, and first processing circuits 111 therefore can operate at both low power and high speed at a low voltage A of 1.2 V. Thus, although the gate leak current during standby of first transistors 121, which have the thinnest gate insulation film 130, cannot be ignored, no gate leak current occurs in first processing circuits 111 during standby because power-supply voltage is not applied.

In second processing circuit 112, thickness b of gate insulation film 130 of second transistors 122 is 24 Å, which is several Å thicker than thickness a, and the gate leak current when driven by low voltage B of 1.2 V is minimal. Second processing circuit 112, which has minimal gate leak current, thus operates constantly during standby of portable telephone 10 and controls the supply of voltage to first processing circuits 111, for which the gate leak current cannot be ignored, and the total power consumption is therefore reduced in integrated circuit device 100 of this embodiment.

Second transistors 122, for which gate insulation film 130 is thick and which are driven at a low voltage as described hereinabove, cannot operate at as high a speed as transistors 121, which have the thinnest gate insulation film 130. Nevertheless, second processing circuit 112 operates during standby when high-speed operation is not required, and the slow operating speed of second transistors 122 therefore does not pose any problem.

Figure 4A:
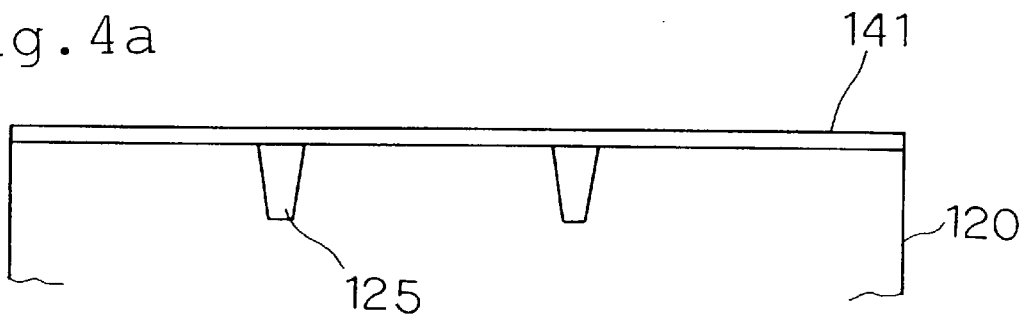
FIGS. 4(a) to 4(c) is a process chart showing the first half of the circuit fabrication method according to the first embodiment of the present invention.

The method of fabricating integrated circuit device 100 of this embodiment is next explained. First, semiconductor substrate 120 is prepared, and as shown in FIG. 4a, trenches 125 are formed at positions that separate first to third transistors 121–123, following which thermal oxidation film 141 is grown to a thickness of 65 Å over the entire surface of semiconductor substrate 120 by thermal oxidation at 850° C.

Figure 4B:
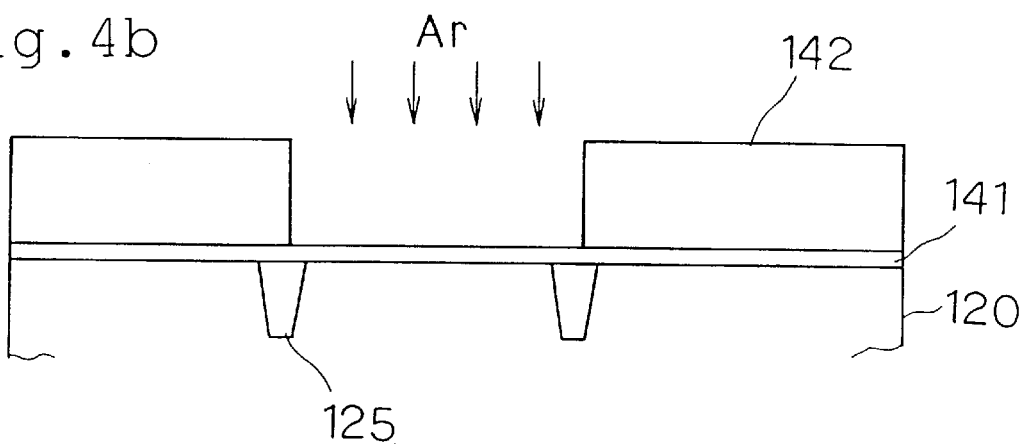
Figure 4C:
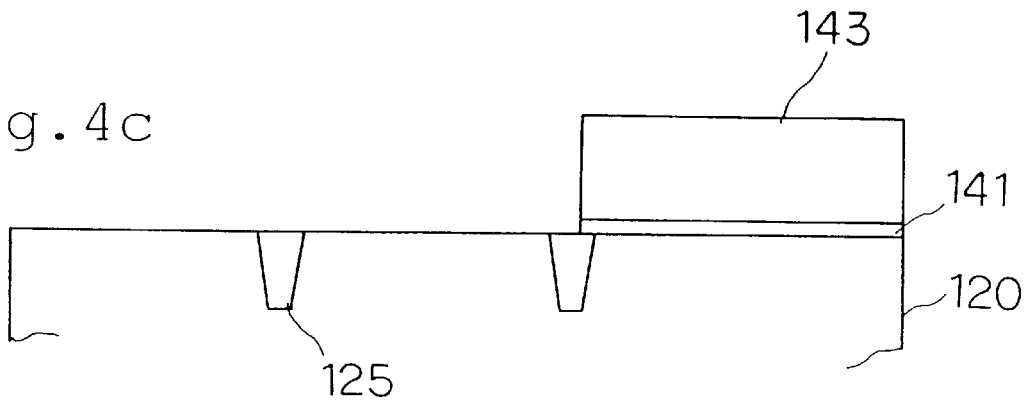

Next, a photoresist is applied over the entire surface of this thermal oxidation film 141, after which the photoresist is removed by photolithography at only the position of second processing circuit 112, thereby forming resist mask 142 on the surface of thermal oxidation film 141 at the positions of first processing circuits 111 and I/O circuit 113, as shown in FIG. 4b. Since this resist mask 142 exposes thermal oxidation film 141 only at the position of second processing circuit 112, argon ions can be implanted at an intensity of 20 KeV to a dose of $5 \times 10^{14}/cm^2$ in thermal oxidation film 141 at this exposed position of second processing circuit 112. Following the implantation of argon ions, resist mask 142 is removed and, as shown in FIG. 4c, resist mask 143 is again formed at only the position of I/O circuit 113. Thermal oxidation film 141 is then removed by etchant at the positions of first and second processing circuits 111 and 112 that are left exposed by this resist mask 143. This process is carried out because thermal oxidation film 141 has been damaged by argon ions, and the film must be removed and then formed again.

Figure 5A:
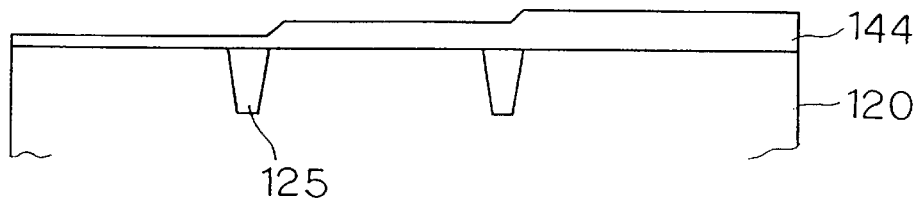
FIGS. 5(a) to 5(c) is a process chart showing the latter half of the circuit fabrication method.

Next, after removing resist mask 143, the entire surface of semiconductor substrate 120 is subjected to a 1000° C. heat process for 10 seconds and a single thermal oxidation film 144 is grown over the entire surface of semiconductor substrate 120 as shown in FIG. 5a. Thermal oxidation film 144 that has been grown in this way has a thickness of 20 Å at the position of first processing circuits 111.

At the position of second processing circuit 112, however, the initial speed of oxidation is increased by the implantation of argon, and the thickness of thermal oxidation film 144 is thus 24 Å, which is several Å greater than at the positions of first processing circuits 111. At the position of I/O circuit 113, the previous formation of thermal oxidation film 141 results in a thickness of thermal oxidation film 144 of 70 Å.

Figure 5B:
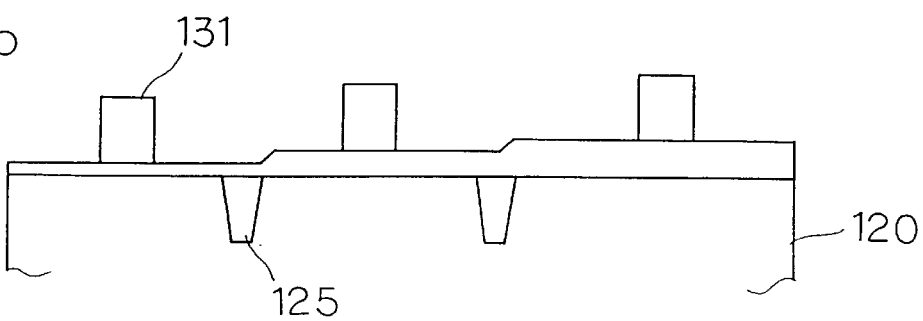
Figure 5C:
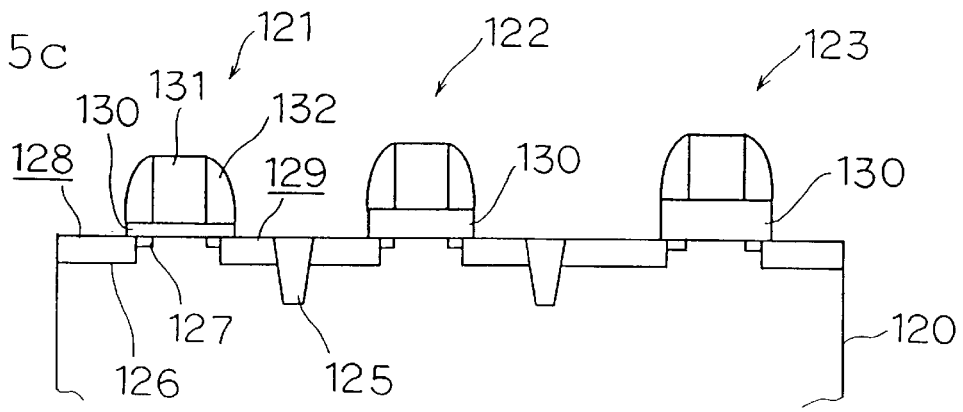

The succeeding processes are the same as for the circuit fabrication method of the prior art, and as shown in FIG. 5b, a polysilicon film is formed across the entire surface of thermal oxidation film 144 and patterned to form gate electrode 131, and high-concentration n-type diffusion layer 126 is formed in portions by ion implantation that is limited by a mask. After growing an oxide film to 800 Å overall, the first to third transistors 121–123 of integrated circuit device 100 are completed by forming sidewalls 132 by etchback, forming low-concentration n-type diffusion layer 127 by another ion implantation, and forming interlayer film, contact holes, and wiring as shown in FIG. 5c.

The thicknesses a–c of gate insulation films 130 of first to third transistors 121–123 in integrated circuit device 100 that has been fabricated by the above-described method satisfies the relation a<b<c.

Consequently, in integrated circuit device 100 of this embodiment, I/O circuit 113, in which gate insulation film 130 of third transistor 123 has the greatest thickness at 70 Å, can be operated at high speed with minimal gate leak current by a high voltage C of 3.3 V, and first processing circuits 111, in which gate insulation film 130 of first transistors 121 is thinnest at 20 Å, can be operated at both high speed and low energy consumption at a low voltage A of 1.2 V.

Second processing circuit 112, in which gate insulation film 130 of second transistor 122 has a thickness b that, at 24 Å, is several Å greater than thickness a, can be operated with minimal gate leak current by a low voltage B of 1.2 V. Second processing circuit 112 cannot operate as fast as first processing circuits 111, but speed is not a problem because second processing circuit 112 operates during standby. First processing circuits 111 have a gate leak current that is not minimal, but this gate leak current is not consumed needlessly because these circuits are halted and not supplied with voltage during standby under the control of second processing circuit 112.

Thus, in integrated circuit device 100 of this embodiment, transistors 121–123 of first processing circuits 111, second processing circuit 112, and I/O circuit 113, which are integrated on a single semiconductor substrate 120, are optimized according to respective modes and operating speeds, whereby the integrated circuit device is capable of comprehensively realizing high-speed operation while reducing leak current, and can provide both a higher level of performance as well as a lower level of energy consumption.

Although an example was presented in the above-described embodiment in which each of transistors 121–123 was n-type of LDD form, other forms are of course possible.

In the above-described embodiment, moreover, an example was presented in which I/O circuit 113, which is the third processing circuit, was operated constantly in both active mode and standby mode, but it is also possible for second processing circuit 112 to halt the power supply of I/O circuit 113 during standby mode to realize a further reduction of power consumption.

In the above-described embodiment, portable telephone 10 was presented as the electronic apparatus that can be switched between an active mode and standby a mode, but the present invention may also be applied to various other types of electronic devices, such as notebook computers, that are driven by battery 103. In addition, although various numerical values were specified in the above-described embodiment, these values can of course be varied in an actual product.

Although a case was presented in the above-described embodiment in which argon was ion-implanted only at the position of second processing circuit 112 to make gate insulation film 130 of second transistor 122 thicker than gate insulation film 130 of first transistor 121, which is grown simultaneously by a thermal oxidation method, the substance of this ion implantation may also be fluorine or a fluorine compound.

Conversely, to make gate insulation film 130 of first transistor 121 thinner than gate insulation film 130 of second transistor 122, which is simultaneously grown by a thermal oxidation method, a substance may also be implanted to reduce the growth of the thermal oxidation film at the positions of first processing circuits 111. This type of circuit fabrication method is described hereinbelow as the second embodiment of the present invention.

Second Embodiment

The components in these embodiments which correspond to the components of the first embodiment are assigned identical reference numerals and are not further discussed below.

Figure 6A:
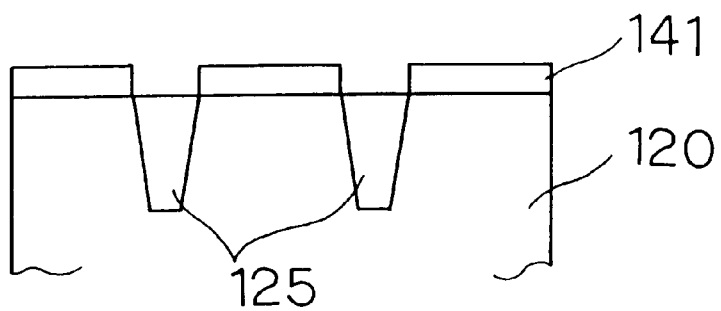
FIGS. 6(a) to 6(c) is a process chart showing the first half of a circuit fabrication method according to the second embodiment of the present invention.

In the circuit fabrication method of this embodiment as well, trenches 125 are formed at positions that separate first to third transistors 121–123 of semiconductor substrate 120 as shown in FIG. 6a, following which thermal oxidation film 141 is grown to a thickness of 5.0 nm over the entire surface of semiconductor substrate 120.

Figure 6B:
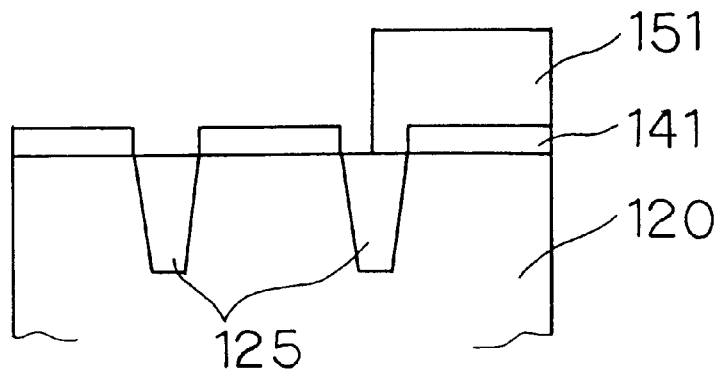

Next, photoresist is applied over the entire surface of this thermal oxidation film 141, following which resist mask 151 is formed on the surface of thermal oxidation film 141 at only the position of I/O circuit 113 by removing the photoresist by photolithography at only the positions of first and second processing circuits 111 and 112, as shown in FIG. 6b.

This resist mask 151 exposes thermal oxidation film 141 at only the positions of first and second processing circuit 111 and 112, and after removing thermal oxidation film 141 at the positions of these exposed first and second processing circuits 111 and 112 by wet etching, resist mask 152 is again formed at the positions of second processing circuit 112 and I/O circuit 113.

Figure 6C:
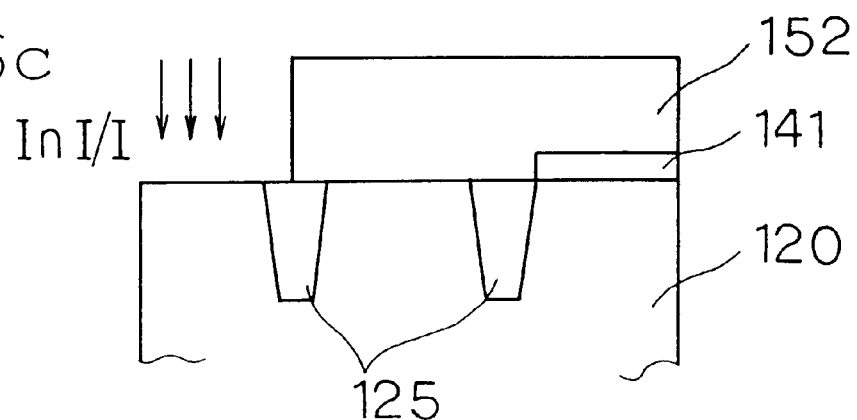

This resist mask 152 exposes thermal oxidation film 141 at only the positions of first processing circuits 111, and indium ions (In+) are implanted at an intensity of 100–300 KeV to a dose of $1 \times 10^{12}/cm^2 - 3 \times 10^{13}/cm^2$ into thermal oxidation film 141 at the positions of these exposed first processing circuits 111 as shown in FIG. 6c.

Figure 7A:
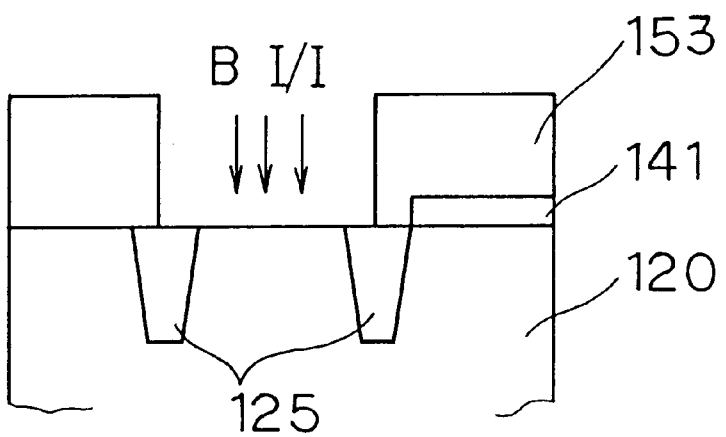
FIGS. 7(a) to 7(b) is a process chart showing the latter half of the circuit fabrication method.
Figure 7B:
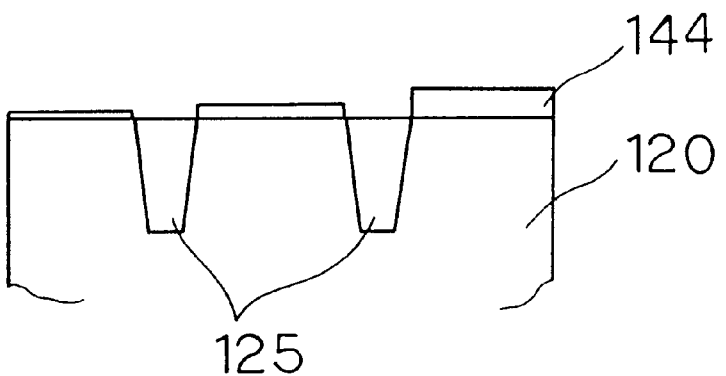

After this indium ion implantation, resist mask 153 is again formed at only the positions of first processing circuits 111 and I/O circuit 113 as shown in FIG. 7a, and boron ions (B+) are then implanted in thermal oxidation film 141 at an intensity of 10–50 KeV to a dose of $1 \times 10^{12}/cm^2 - 3 \times 10^{13}/cm^2$ at the position of second processing circuit 112 that is exposed from this resist mask 153.

Resist mask 153 is then removed, following which a single thermal oxidation film 144 is grown across the entire surface of semiconductor substrate 120, the thickness of this thermal oxidation film 144 being 25 Å at the position of second processing circuit 112. At this time, the initial speed of oxidation is reduced at the position of first processing circuit 111 due to the implantation of indium, and the thickness of thermal oxidation film 144 here is therefore 20 Å, which is several Å thinner than at the position of second processing circuit 112. In addition, the thickness of thermal oxidation film 144 at the position of I/O circuit 113 is 70 Å due to the previous formation of thermal oxidation film 141.

The subsequent processes are the same as for the circuit fabrication method of the prior art, and in integrated circuit device 100 that is fabricated by the above-described circuit fabrication method, the thicknesses a–c of gate insulation films 130 of first to third transistors 121–123 satisfy the relation a<b<c.

The layer thickness and threshold value voltage of first transistor 121 is appropriately controlled because indium has been ion-implanted into gate insulation film 130 of first transistor 121. Although boron has been ion-implanted into gate insulation film 130 of second transistor 122, this implantation is for controlling the threshold voltage and is not related to control of the film thickness.

In the above-described embodiment, a case was described in which indium is ion-implanted at only the positions of first processing circuits 111 to make gate insulation film 130 of first transistor 121 thinner than gate insulation film 130 of second transistor 122, which is grown simultaneously by a thermal oxidation method. However, the material that is ion-implanted may also be nitrogen.

Third Embodiment

Figure 8A:
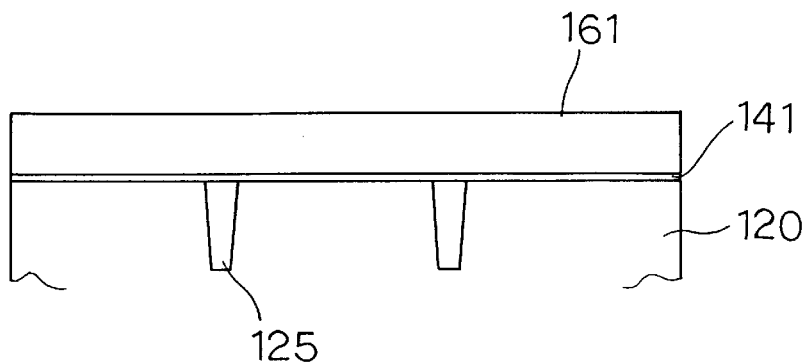
FIGS. 8(a) to 8(c) is a process chart showing the first portion of the circuit fabrication method according to the third embodiment of the present invention.

As shown in FIG. 8a, in the circuit fabrication method of this embodiment as well, trenches 125 are formed at positions that separate first to third transistors 121–123 of semiconductor substrate 120, following which thermal oxidation film 141 is grown over the entire surface, and first polysilicon film 161 is formed as a conductive layer over the entire surface of this thermal oxidation film 141.

Figure 8B:
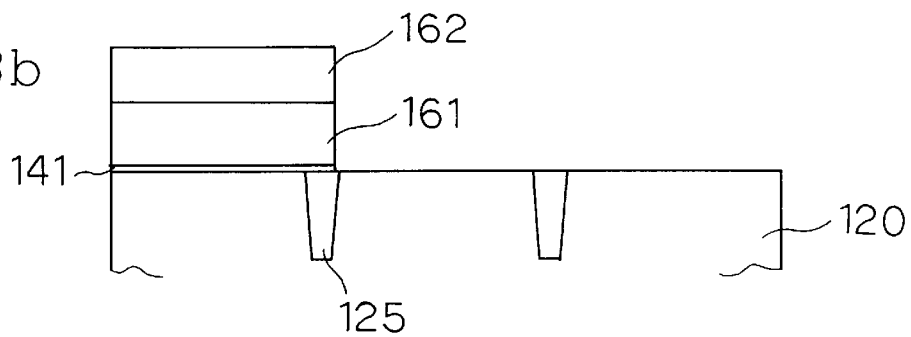

Next, as shown in FIG. 8b, resist mask 162 is formed on the surface of first polysilicon film 161 at the positions of first processing circuits 111, and polysilicon film 161 is removed only at the positions of second processing circuit 112 and I/O circuit 113 that are exposed from this resist mask 162.

Figure 8C:
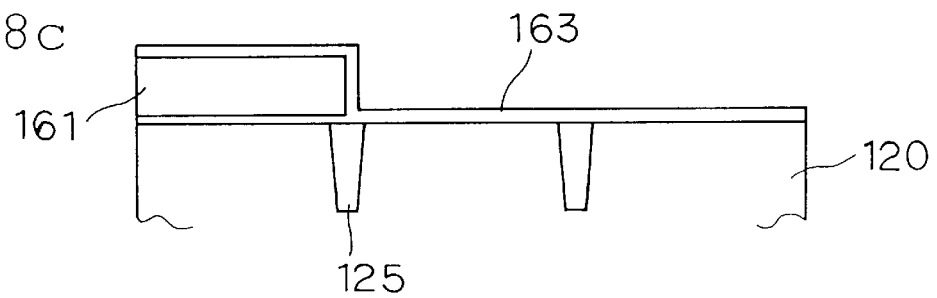

Since first polysilicon film 161 is formed as a thermal oxidation mask at only the positions of first processing circuits 111, after removing resist mask 162, thermal oxidation film 163 is grown on the surface at the positions of second processing circuit 112 and I/O circuit 113, as shown in FIG. 8c. This thermal oxidation film 163 is also formed on the surface of first polysilicon film 161 at this time and becomes a unit with thermal oxidation film 141 that underlies this first polysilicon film 161.

Figure 9A:
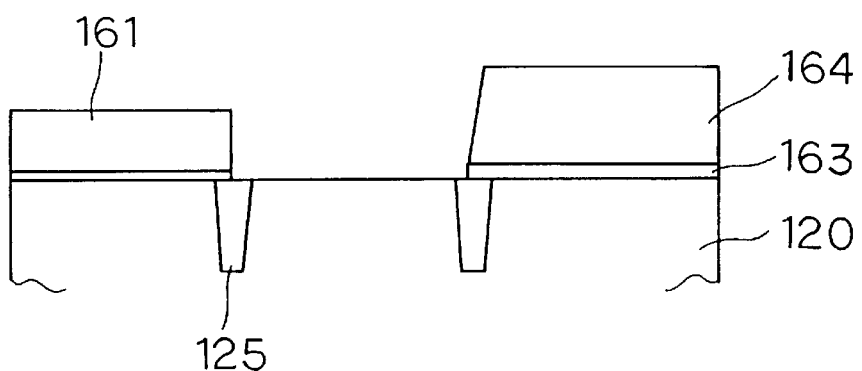
FIGS. 9(a) to 9(c) is a process chart showing the middle portion of the circuit fabrication method.

Next, resist mask 164 is formed on the surface of this thermal oxidation film 163 at the position of I/O circuit 113, and as shown in FIG. 9a, thermal oxidation film 163 is etched and removed from the surface of first polysilicon film 161 and the position of second processing circuit 112 that is left exposed by this resist mask 164.

Figure 9B:
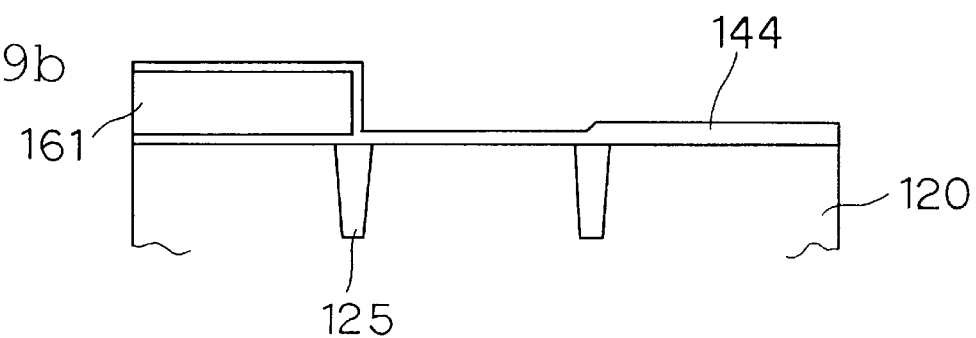
Figure 9C:
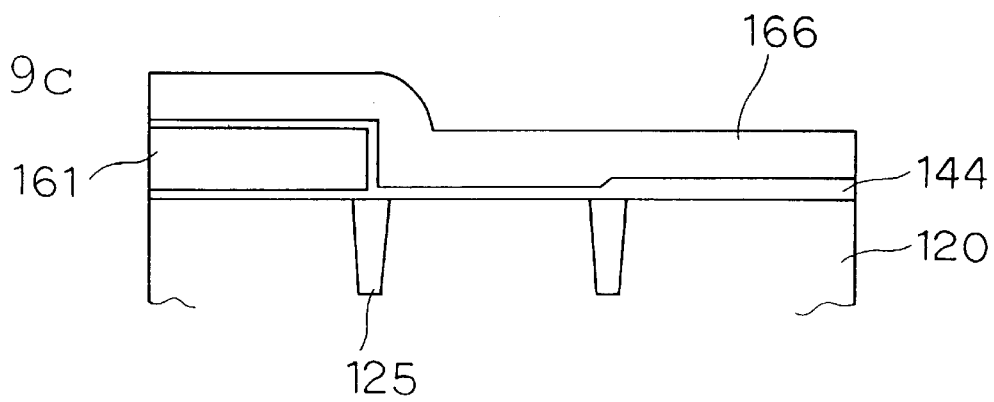

After removing this thermal oxidation film 163, resist mask 164 is removed, and as shown in FIG. 9b, thermal oxidation film 144 is grown over the entire surface at the positions of second processing circuit 112 and I/O circuit 113 and first polysilicon film 161. The thicknesses a–c of thermal oxidation film 144 at the positions of first processing circuits 111, second processing circuit 112, and I/O circuit 113 thus satisfy the relation a<b<c.

In the circuit fabrication method of this embodiment, moreover, second polysilicon film 166 is formed as a conductive layer over the entire surface thermal oxidation film 144 that has been formed as described hereinabove, and resist mask 167 is formed over the surface of this second polysilicon film 166 at the positions of second processing circuit 112 and I/O circuit 113.

Figure 10A:
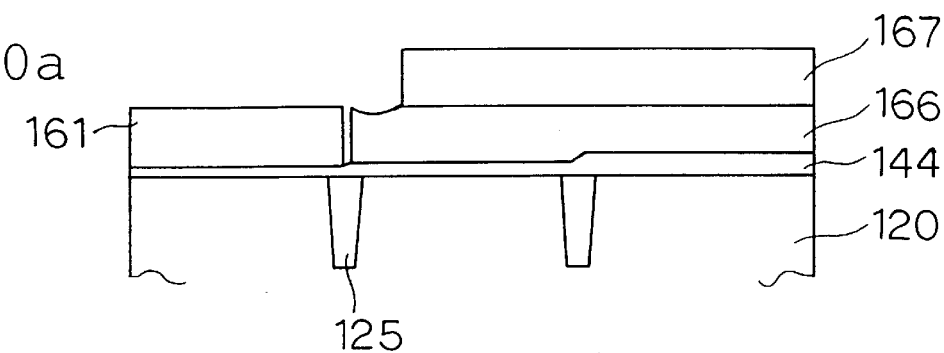
FIGS. 10(a) to 10(c) is a process chart showing the latter portion of the circuit fabrication method.

As shown in FIG. 10a, second polysilicon film 166 at the positions of first processing circuits 111 that is exposed from this resist mask 167 is removed by anisotropic etching, and thermal oxidation film 144 at the position of first processing circuit 111 that is exposed by this removal is then removed by wet etching.

Figure 10B:
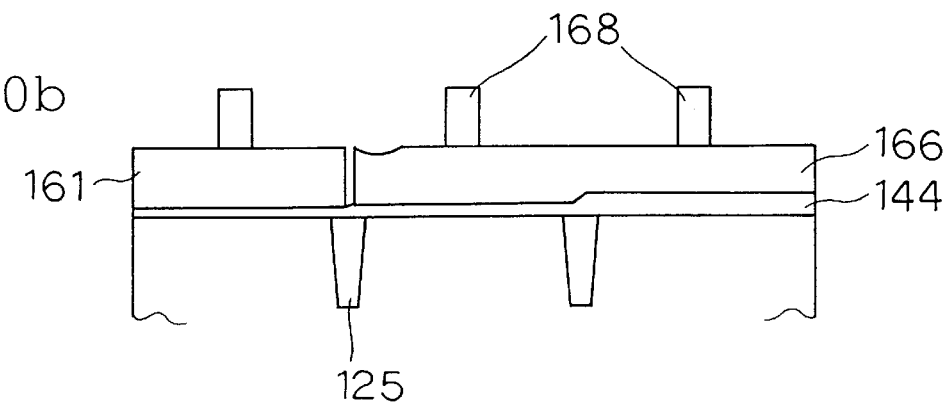
Figure 10C:
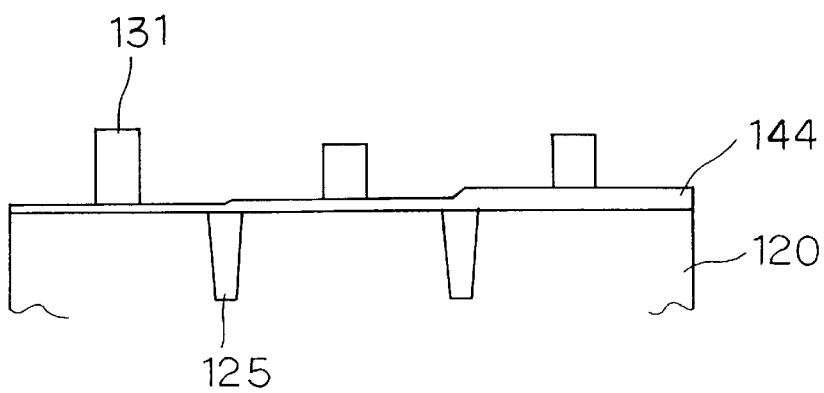

First polysilicon film 161 is thus exposed, and as shown in FIG. 10b, resist mask 167 is removed from the positions of second processing circuit 112 and I/O circuit 113 to expose second polysilicon film 166, and resist mask 168 in the shape of gate electrode 131 is formed on the surfaces of first and second polysilicon films 161 and 166.

Gate electrodes 131 of first to third transistors 121–123 are then simultaneously formed by both patterning first polysilicon film 161 in the positions of first processing circuits 111 by means of this resist mask 168 and patterning second polysilicon film 166 at the positions of second processing circuit 112 and I/O circuit 113.

In the circuit fabrication method of this embodiment, a relation of a<b<c can be established between the thicknesses a–c of gate insulation films 130 of first to third transistors 121–123 without the need for ion implantation by forming first polysilicon film 161 as a thermal oxidation mask.

Moreover, the productivity of integrated circuit device 100 can also be improved because gate electrode 131 of first transistors 121 can be formed from first polysilicon film 161, which is used to control the thicknesses of gate insulation films 130 of first to third transistors 121–123.

Fourth Embodiment

Figure 11A:
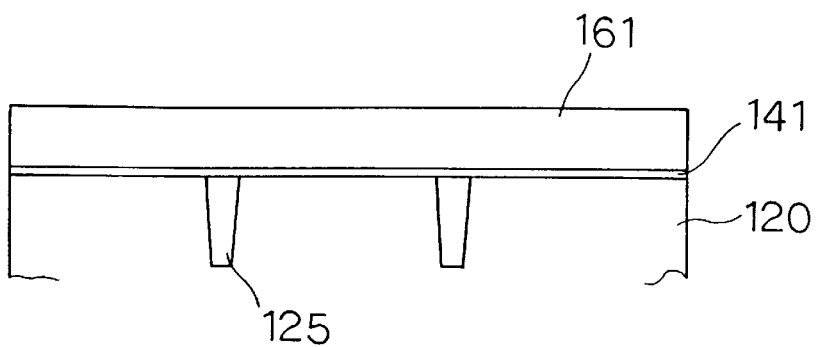
FIGS. 11(a) to 11(c) is a process chart showing the first portion of a circuit fabrication method according to the fourth embodiment of the present invention.
Figure 11B:
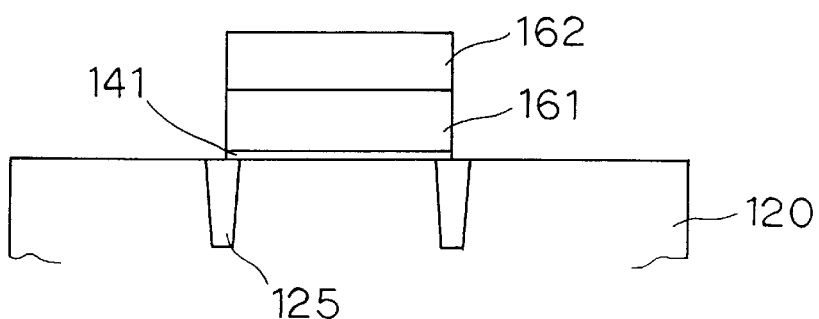

As shown in FIG. 11a, in the circuit fabrication method of this embodiment as well, trenches 125 are formed in semiconductor substrate 120, and thermal oxidation film 141 and first polysilicon film 161 are then successively formed over the entire surface. However, as shown in FIG. 11b, resist mask 162 is then formed at the position of second processing circuit 112 on the surface of this first polysilicon film 161, and first polysilicon film 161 is removed at only the positions of first processing circuits 111 and I/O circuit 113.

Figure 11C:
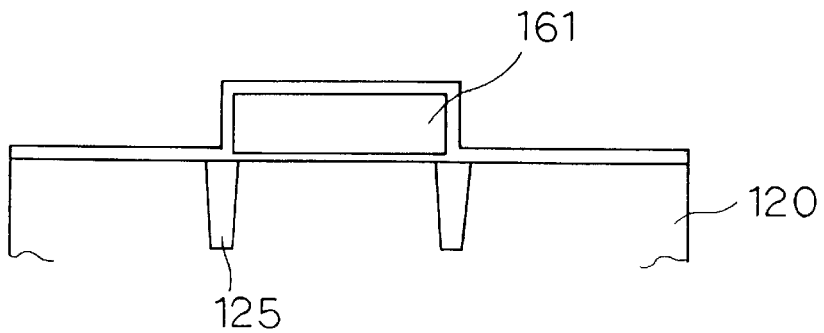

Since first polysilicon film 161 is formed as a thermal oxidation mask only at the position of second processing circuit 112, resist mask 162 is removed and thermal oxidation film 163 is grown on the positions of first processing circuits 111 and I/O circuit 113 and the surface of first polysilicon film 161 as shown in FIG. 11c.

Figure 12A:
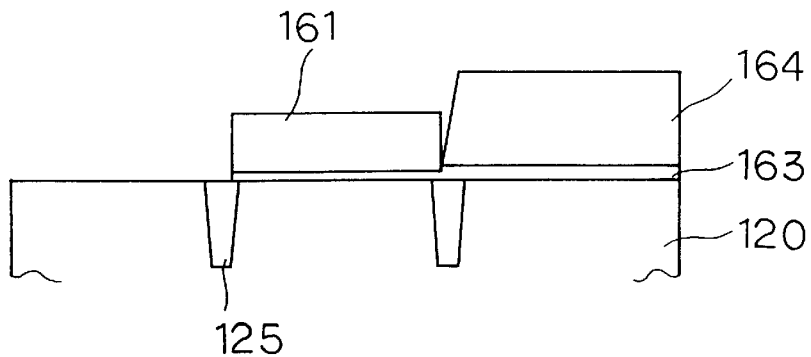
FIGS. 12(a) to 12(c) is a process chart showing the middle portion of the circuit fabrication method.

Next, resist mask 164 is formed on the surface of this thermal oxidation film 163 at the position of I/O circuit 113, and, as shown in FIG. 12a, thermal oxidation film 163 is removed by etching from the surface of first polysilicon film 161 and the position of first processing circuit 111 that are left exposed by this resist mask 164.

Figure 12B:
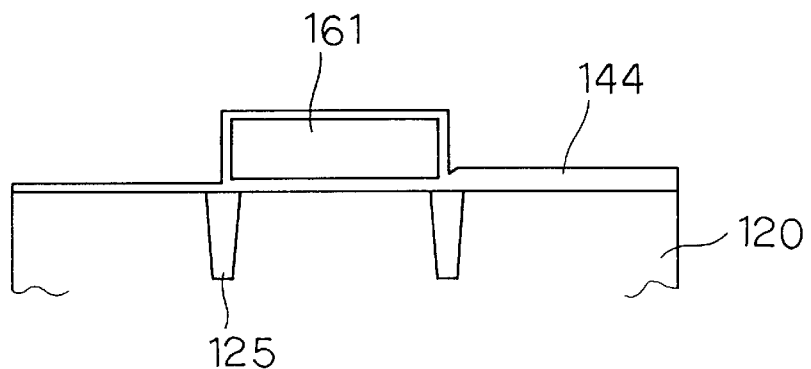

After removing this thermal oxidation film 163, resist mask 164 is removed, and thermal oxidation film 144 is grown over the entire surface of first polysilicon film 161 and the positions of first processing circuits 111 and I/O circuit 113, as shown in FIG. 12b. The thicknesses a–c of thermal oxidation film 144 at the positions of first processing circuits 111, second processing circuit 112, and I/O circuit 113 therefore satisfy the relation a<b<c.

Figure 12C:
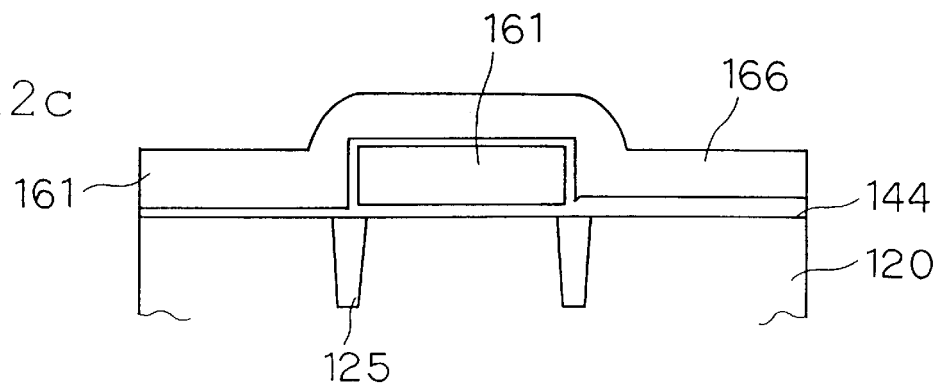

In the circuit fabrication method of this embodiment, moreover, as shown in FIG. 12c, second polysilicon film 166 is formed over the entire surface of thermal oxidation film 144 that has been formed as described hereinabove, and resist mask 167 is formed on the surface of this second polysilicon film 166 at the positions of first processing circuits 111 and I/O circuit 113.

Figure 13A:
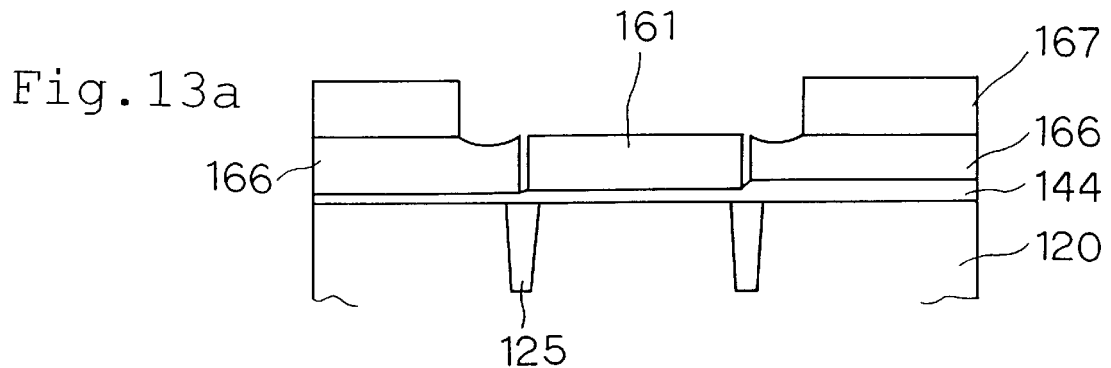

As shown in FIG. 13a, second polysilicon film 166 at the position of second processing circuit 112 that is exposed by this resist mask 167 is removed by anisotropic etching, and thermal oxidation film 144 at the position of second processing circuit 112 that is exposed by this removal is then removed by wet etching.

Figure 13B:
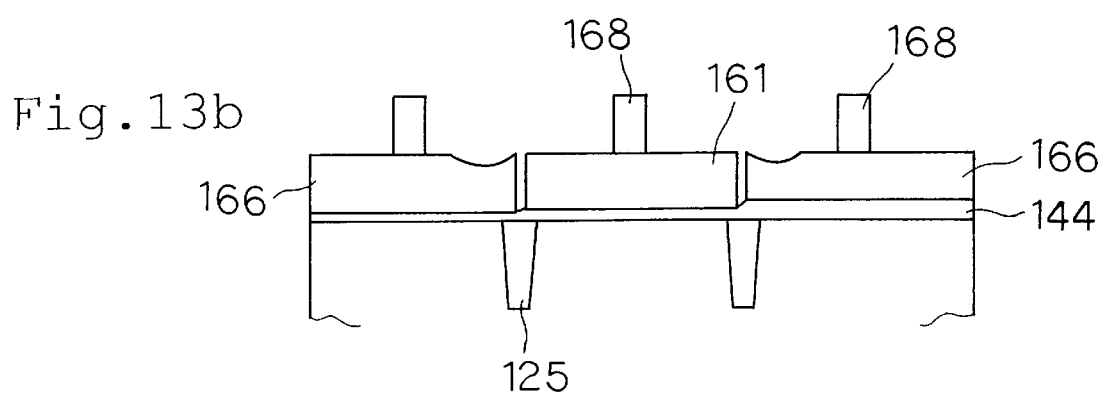
Figure 13C:
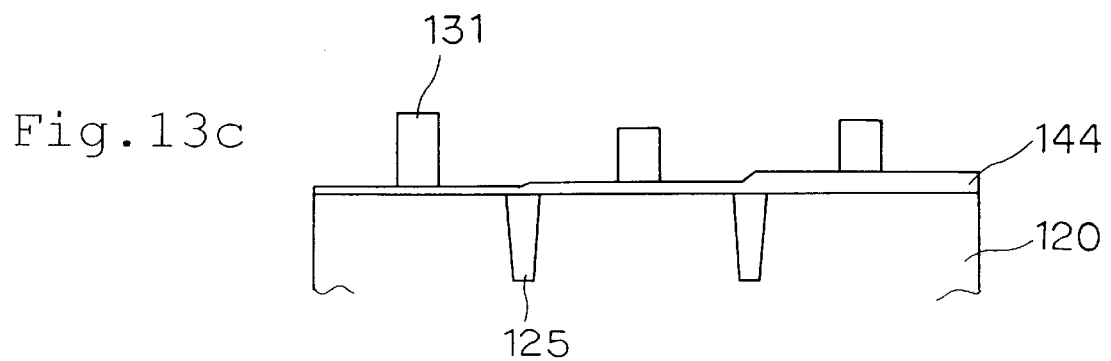
FIGS. 14(a) to 13(c) is a process chart showing the first half of the circuit fabrication method according to the fifth embodiment of the present invention.

First polysilicon film 161 is thus exposed, and as shown in FIG. 13b, resist mask 167 is then removed from the positions of first processing circuits 111 and I/O circuit 113 to expose second polysilicon film 166, and the gate electrodes 131 of first to third transistors 121–123 are then formed simultaneously by patterning first and second polysilicon film 161 and 166.

In the circuit fabrication method of this embodiment as well, the thicknesses a–c of gate insulation films 130 of first to third transistors 121–123 can be made to satisfy the relation a<b<c without requiring ion implantation by forming first polysilicon film 161 as a thermal oxidation mask, and gate electrode 131 of second transistor 122 can be formed from first polysilicon film 161.

Fifth Embodiment

Figure 14A:
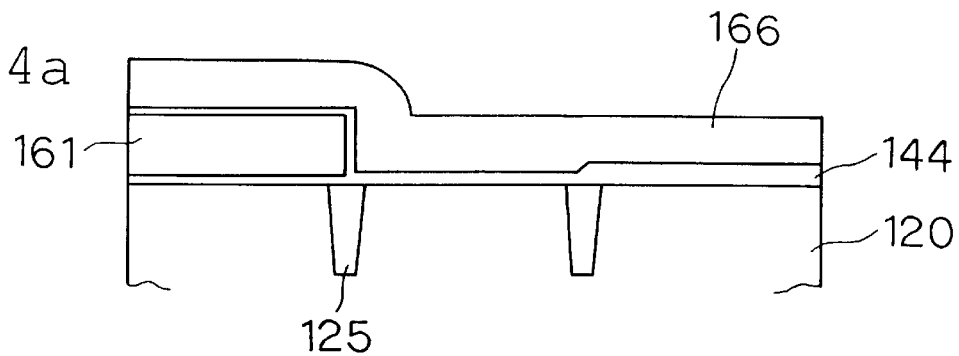

As shown in FIG. 14a, in the circuit fabrication method of this embodiment as well, similar to the above-described third embodiment, thermal oxidation film 144 is formed over the surface of semiconductor substrate 120 such that the thicknesses a–c of thermal oxidation film 144 at the positions of first processing circuits 111, second processing circuit 112, and I/O circuit 113 satisfy the relation a <b<c, with first polysilicon film 161 being formed at the position of first processing circuits 111 and second polysilicon film 166 being formed over the entire surface.

Figure 14B:
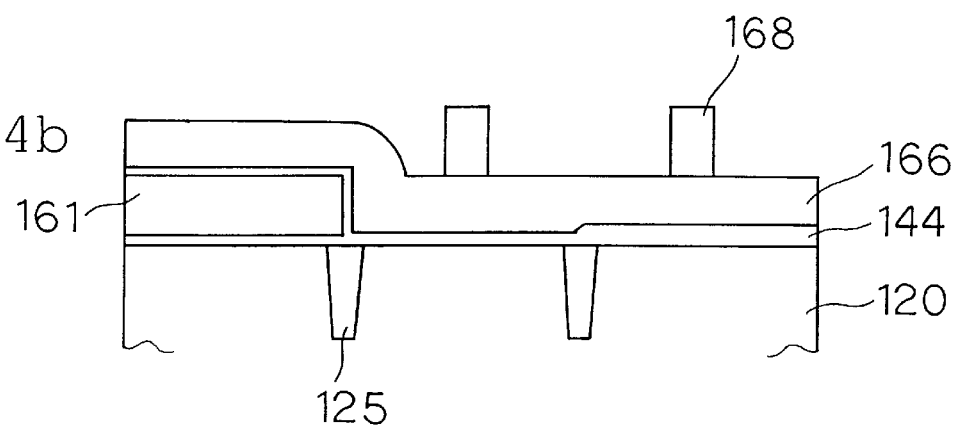
Figure 14C:
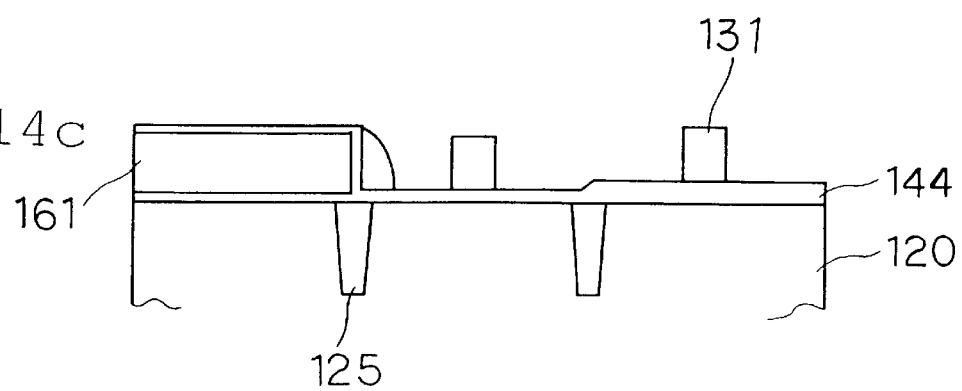

From this state, as shown in FIG. 14b, resist mask 171 is formed on the surface of second polysilicon film 166 in the shape of gate electrodes 131 of second and third transistor 122 and 123, and as shown in FIG. 14c, gate electrodes 131 of second and third transistors 122 and 123 are then formed by patterning second polysilicon film 166 at the positions of second processing circuit 112 and I/O circuit 113 by means of anisotropic etching that uses this resist mask 171.

At this time, second polysilicon film 166 is removed from the positions of first processing circuits 111, but at the position of these first processing circuits 111, the thermal oxidation film of first polysilicon film 161 is positioned as the layer underlying second polysilicon film 166 and the anisotropic etching is thus stopped by this thermal oxidation film.

Figure 15A:
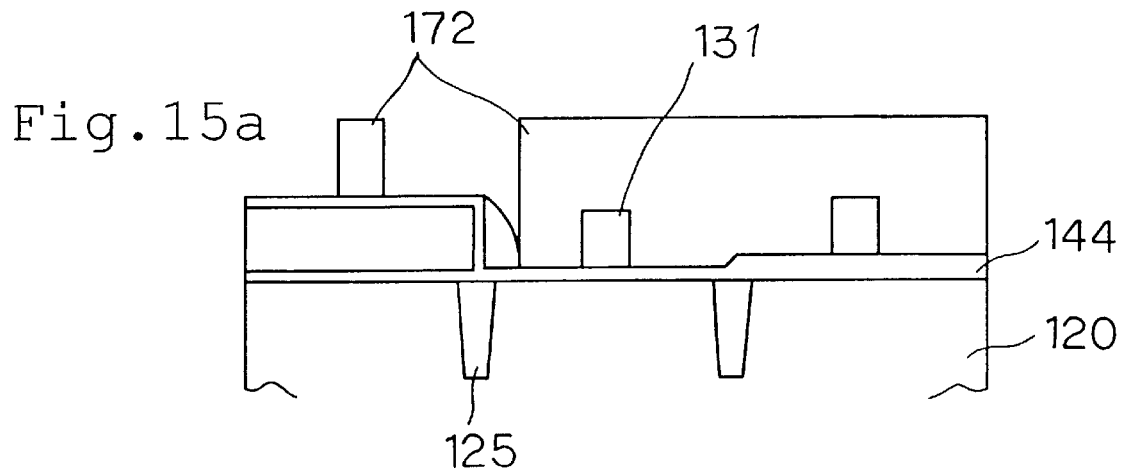
FIGS. 15(a) to 15 (c) is a process chart showing the last half of the circuit fabrication method.

Next, as shown in FIG. 15a, the positions of second processing circuit 112 and I/O circuit 113 are shielded and resist mask 172 is formed corresponding to the shape of gate electrode 131 of first transistor 121, and gate electrode 131 of first transistor 121 is then formed by patterning first polysilicon film 161 at the positions of first processing circuits 111 that are exposed by this resist mask 172.

Figure 15B:
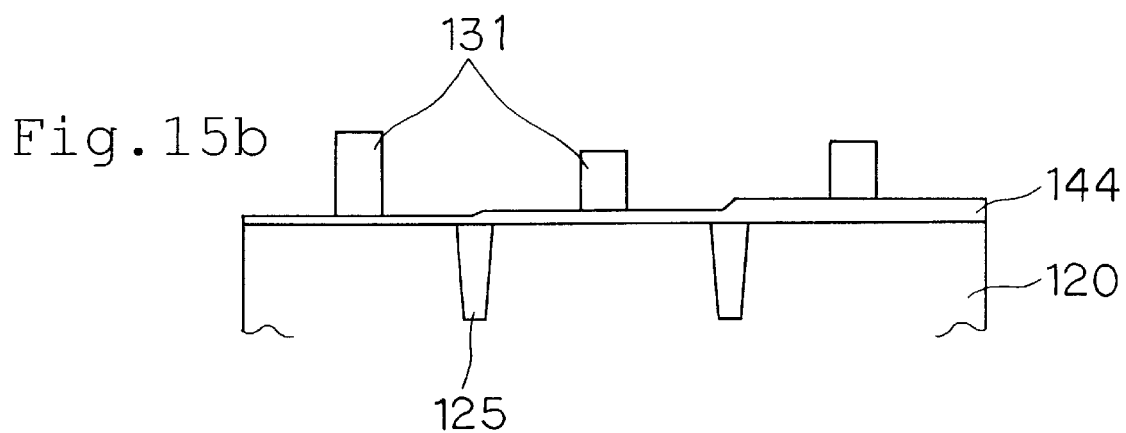

After this formation, resist mask 172 is next removed, and, as shown in FIG. 15b, gate electrodes 131 of first to third transistors 121–123 are formed on the surface of thermal oxidation film 144 for which the relation between the thicknesses a–c at the positions of first processing circuits 111, second processing circuit 112, and I/O circuit 113 satisfy the relation a<b<c.

In the circuit fabrication method of this embodiment, the etching of gate electrode 131, which is positioned on the surface of the thinnest gate insulation film 130 of first transistor 121, is performed separately from the etching of gate electrodes 131 of second and third transistors 122 and 123.

As a result, gate electrodes 131 of first to third transistors 121–123 can be etched under the optimum conditions for each even in a case in which the thickness of gate insulation film 130 of first transistor 121 is far thinner than for second and third transistors 122 and 123.

In addition, this type of circuit fabrication method may also be applied to a case in which thermal oxidation film 144 having thicknesses a–c that satisfy the relation a<b<c is formed on the surface of semiconductor substrate 120 as in the previously described fourth embodiment, and first polysilicon film 161 is formed at the position of second processing circuit 112 and second polysilicon film 166 is formed over the entire surface.

Figure 16A:
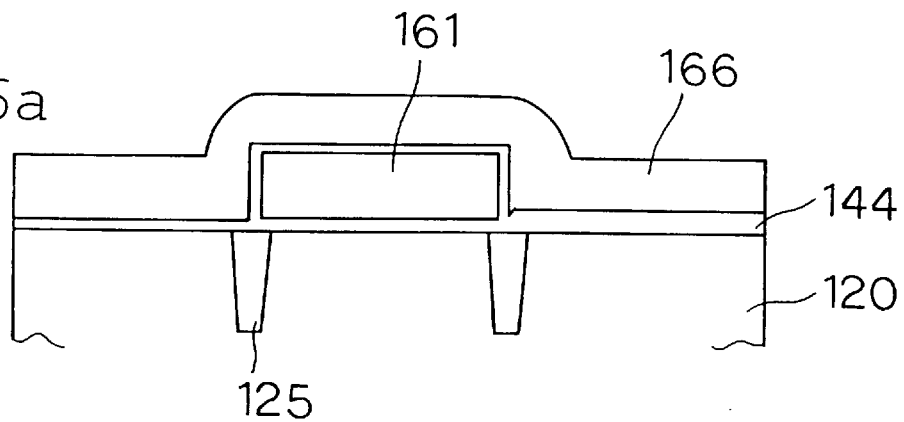
FIGS. 16(a) to 16(c) is a process chart showing the first half of the circuit fabrication method according to the sixth embodiment of the present invention.
Figure 16B:
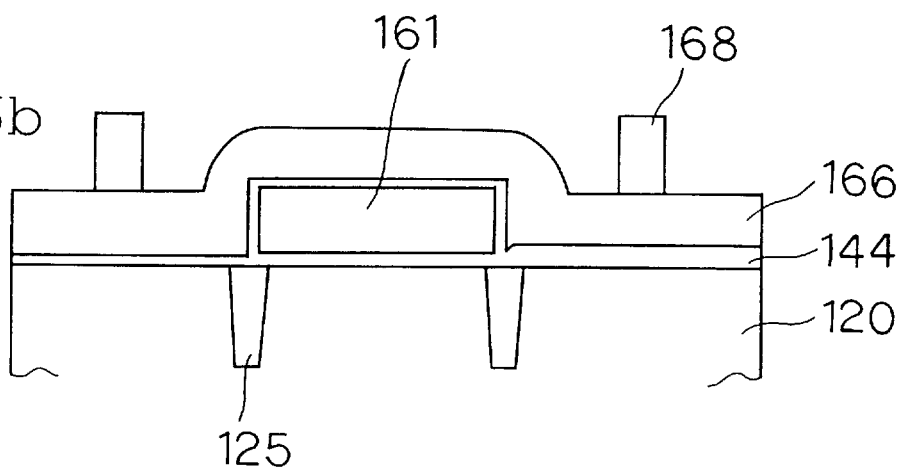
Figure 16C:
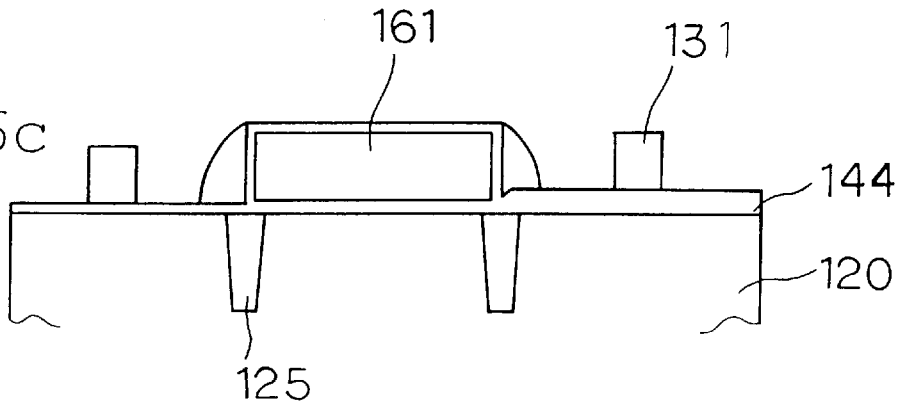
Figure 17A:
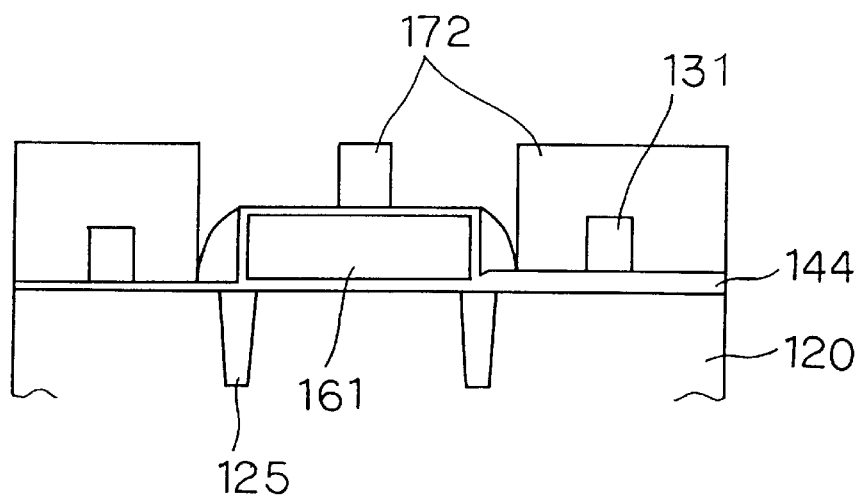
Figure 17B:
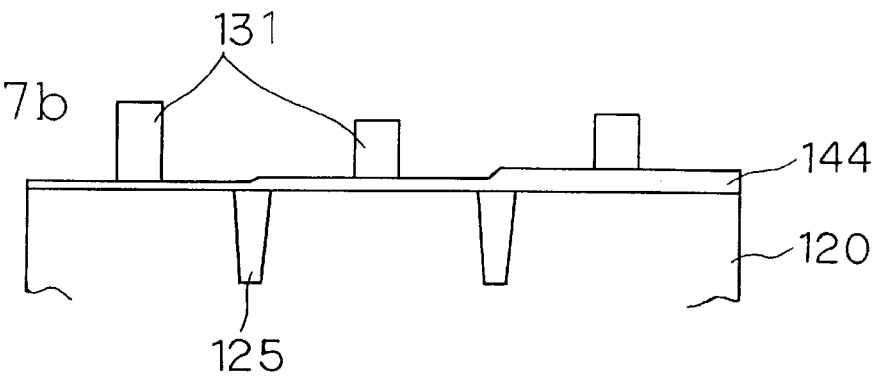

In this case, as shown in FIG. 16 and FIG. 17, the etching of gate electrode 131 positioned on the surface of gate insulation film 130 of second transistor 122 is performed separately from the etching of gate electrodes 131 of first and third transistors 121 and 123, and gate electrodes 131 of first to third transistor 121–123 can therefore be etched under the optimum conditions for each.

While preferred embodiments of the present invention have been described using specific terms, such description is for illustrative purposes only, and it is to be understood that changes and variations may be made without departing from the spirit or scope of the following claims.

What is claimed is:

1. An integrated circuit device comprising:
   means for switching between an active mode and a standby mode in an integrated circuit device;
   means for generating a power-supply voltage;
   a first processing circuit having a first transistor that has a gate insulation film and that is driven only during said active mode by said power-supply voltage, and
   a second processing circuit having a second transistor that has a gate insulation film that is thicker than the gate insulation film of said first transistor and that is driven both in said active mode and in said standby mode by said power-supply voltage, for controlling the supply of voltage to said first processing circuit in accordance with the switched mode between said active and standby modes.

2. A device according to claim 1, further comprising a third processing circuit having a third transistor that is driven by a higher voltage than said second transistor and that has a gate insulation film that is thicker than the gate insulation film of said second transistor.

3. A device according to claim 1, wherein said second processing circuit turns said first processing circuit ON and OFF.

4. A device according to claim 1, wherein said second processing circuit initiates the supply of voltage to said first processing circuit upon sensing the input of a prescribed signal from the outside in said standby mode.

5. A device according to claim 1, wherein:
   the gate insulation film of said first transistor is composed of a thermal oxidation film that is grown on the surface of a semiconductor substrate; and the gate insulation film of said second transistor is composed of a thermal oxidation film that is grown simultaneously with the gate insulation film of said first transistor on a surface of said semiconductor substrate that has been implanted with at least one of argon, fluorine, and a fluorine compound.

6. A device according to claim 1, wherein:

the gate insulation film of said second transistor is composed of a thermal oxidation film that is grown on the surface of a semiconductor substrate; and the gate insulation film of said first transistor is composed of a thermal oxidation film that is grown simultaneously with the gate insulation film of said second transistor on a surface of said semiconductor substrate that has been implanted with at least one of indium and nitrogen.

7. A device according to claim 1, wherein said power-supply voltage is supplied from a battery that is separate from said integrated circuit device.

8. A device according to claim 7 wherein said power-supply voltage is supplied in common to the first and second processing circuits.

9. An electronic apparatus comprising:

means for switching between an active mode and a standby mode in an integrated circuit device;

a power supply for generating a power-supply voltage;

a battery for supplying main unit power to said power supply;

a power supply switch for controlling the supply of power of said battery with ON/OFF operation;

a first processing circuit having a first transistor that has a gate insulation film, for being supplied with said power-supply voltage in said active mode when said power supply switch is ON, and for which the supply of said power-supply voltage is halted during said standby mode; and a second processing circuit having a second transistor that has a gate insulation film that is thicker than the gate insulation film of said first transistor, for being constantly supplied with said power-supply voltage regardless of the switched mode between said active and standby modes when said power supply switch is turned ON.

10. An electronic apparatus comprising:

means for switching between an active mode and a standby mode in an integrated circuit device;

means for generating a power-supply voltage;

a first processing circuit having a first transistor that has a gate insulation film and that is driven by said power-supply voltage only during active mode;

a second processing circuit having a second transistor that has a gate insulation film that is thicker than the gate insulation film of said first transistor and that is driven by said power-supply voltage during both said active and standby modes, for controlling the supply of voltage to said first processing circuit in accordance with the switched mode between said active and standby modes;

a third processing circuit having a third transistor that has a gate insulation film that is thicker than the gate insulation film of said second transistor and that is driven by a voltage that is higher than said second transistor;

a low-voltage power supply for supplying said power-supply voltage to said first processing circuit and said second processing circuit;

a high-voltage power supply for supplying said high voltage to said third processing circuit; and a notification means for notifying said second processing circuit of prescribed data that allows the determination of whether or not the operation of said first processing circuit is necessary.

* * * * *

UNITED STATES PATENT AND TRADEMARK OFFICE
CERTIFICATE OF CORRECTION

PATENT NO. : 6,388,504 B1
DATED : May 14, 2002
INVENTOR(S) : Yoshiro Goto, Kiyotaka Imai and Naohiko Kimizuka It is certified that error appears in the above-identified patent and that said Letters Patent is hereby corrected as shown below:

Column 11,
Line 30, delete "12(c)" insert -- 13(c) --;
Line 32, delete "13(c)" insert -- 14(c) --;
Line 35, delete "15(c)" insert -- 15(b) --;
Line 40, delete "17(c)" insert -- 17(b) --.

Signed and Sealed this

Fifteenth Day of October, 2002

*Attest:*

*Attesting Officer*

JAMES E. ROGAN
*Director of the United States Patent and Trademark Office*